(12) United States Patent
Codama et al.

(10) Patent No.: US 6,290,563 B1
(45) Date of Patent: Sep. 18, 2001

(54) ORGANIC ELECTROLUMINESCENCE DISPLAY DEVICE AND PRODUCING METHOD THEREOF

(75) Inventors: Mitsufumi Codama; Masaru Tanaka, both of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/653,379

(22) Filed: Sep. 1, 2000

Related U.S. Application Data

(62) Division of application No. 09/274,021, filed on Mar. 22, 1999, now Pat. No. 6,147,442, which is a division of application No. 08/834,733, filed on Apr. 3, 1997, now Pat. No. 6,037,712.

(30) Foreign Application Priority Data

Jun. 10, 1996 (JP) .................................................... 8-147313
Dec. 6, 1996 (JP) .................................................... 8-327045

(51) Int. Cl.[7] .................................................. H04B 33/10
(52) U.S. Cl. ............................ 445/24; 313/504; 313/505
(58) Field of Search .............................. 445/24; 313/504, 313/506

(56) References Cited

U.S. PATENT DOCUMENTS

| | | | |
|---|---|---|---|
| 5,276,380 | 1/1994 | Tang | 313/504 |
| 5,294,869 | 3/1994 | Tang et al. | 313/504 |
| 5,521,465 | 5/1996 | Budzilek et al. | 313/505 X |
| 5,545,946 | 8/1996 | Weimann et al. | 313/497 |
| 5,652,067 | 7/1997 | Ito et al. | 313/504 X |
| 5,656,508 | 8/1997 | So et al. | 438/34 |
| 5,693,962 | 12/1997 | Shi et al. | 257/89 |
| 5,701,055 | * 12/1997 | Nagayama et al. | 313/504 |
| 5,773,931 | 6/1998 | Shi et al. | 313/504 X |
| 5,857,589 | 1/1999 | So et al. | 257/40 |
| 6,057,895 | * 5/2000 | Van Helleputte et al. | 445/24 |

FOREIGN PATENT DOCUMENTS

| | | |
|---|---|---|
| 0732868A1 | 9/1996 | (EP) . |
| 8-262998 | 10/1996 | (JP) . |
| 8-264828 | 10/1996 | (JP) . |

\* cited by examiner

*Primary Examiner*—Kenneth J. Ramsey
(74) *Attorney, Agent, or Firm*—Armstrong, Westerman, Hattori, McLeland & Naughton, LLP

(57) ABSTRACT

In manufacturing of an organic electroluminescence (EL) display device, after first electrodes are formed on a substrate, insulating films are formed on the first electrodes except regions corresponding to light emitting portions. Spacers are formed on the insulating films, and overhanging portions are formed so as to overhang the spacers. Thus, element isolating structure portions for isolating organic EL elements are formed. Then, organic EL films, second electrodes, and protecting films are sequentially formed between the spacers. In the thus formed light emitting portions of the organic EL display device, the bending angle of a bending portion of a pattern of the element isolating structure portion is larger than 90°.

12 Claims, 17 Drawing Sheets

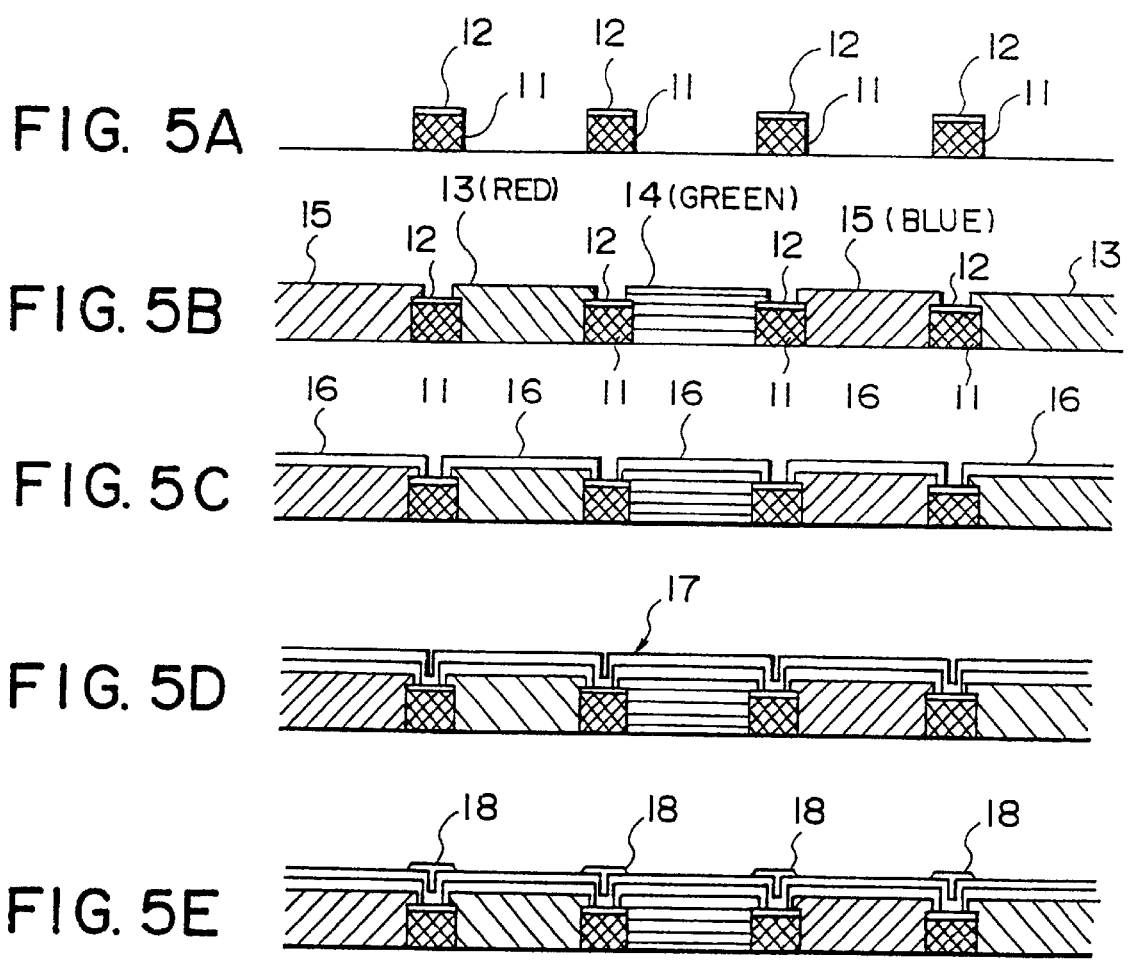

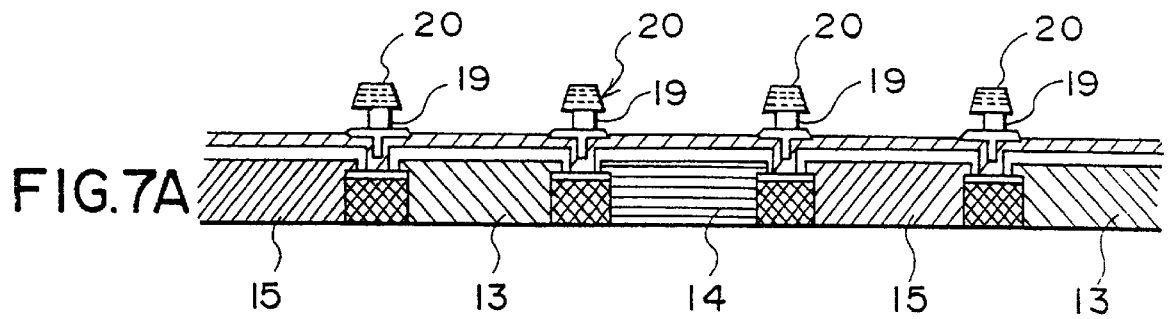
FIG. 7A
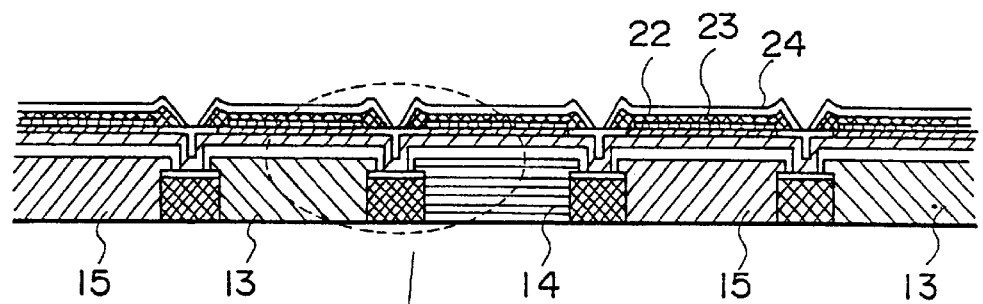
FIG. 7B
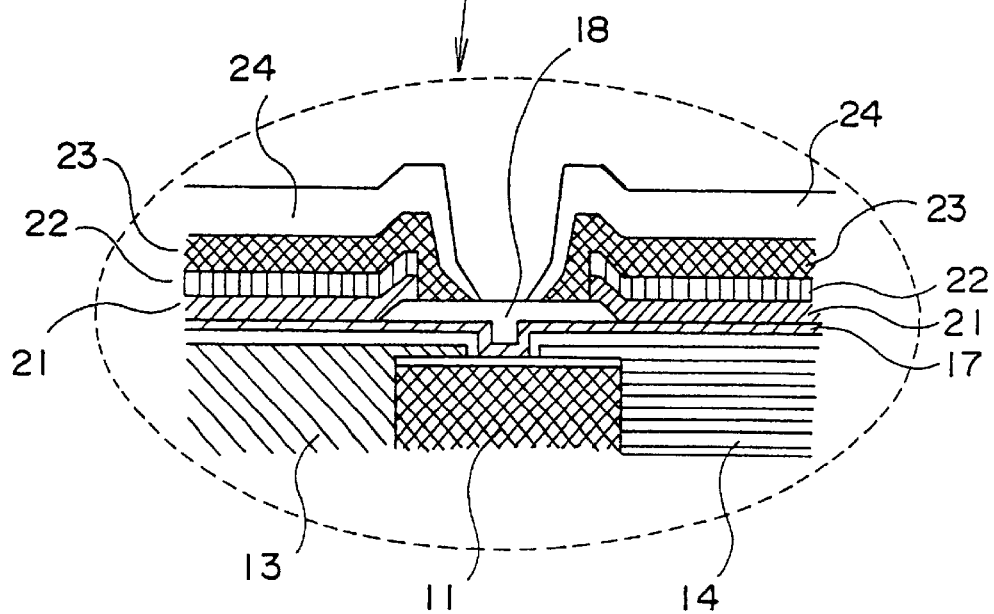

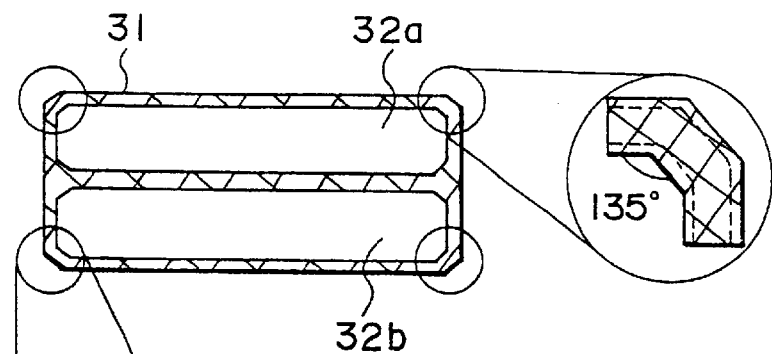
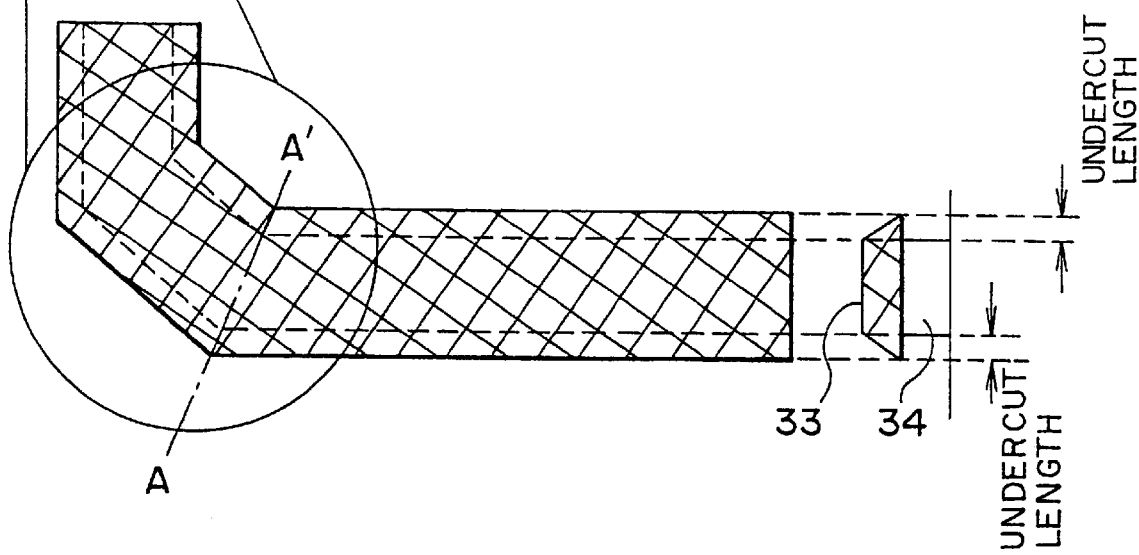
FIG. 9A
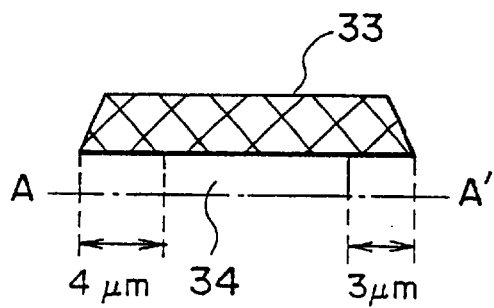
FIG. 9B

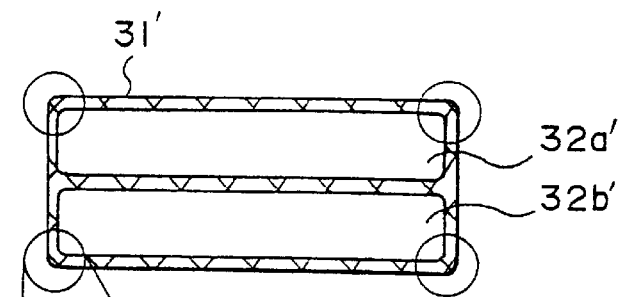
FIG. 10A
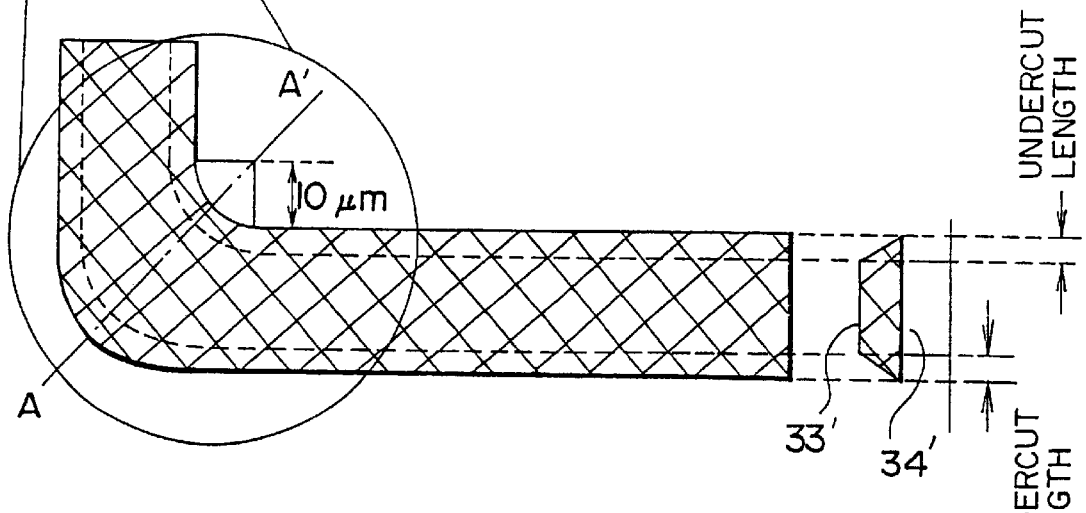
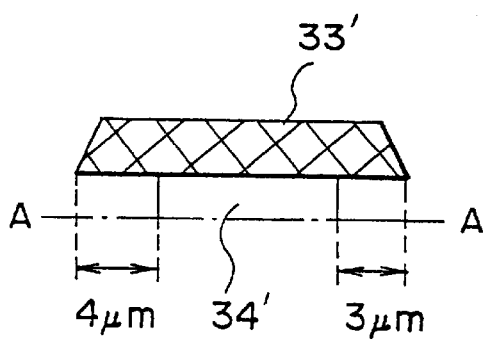
FIG. 10B

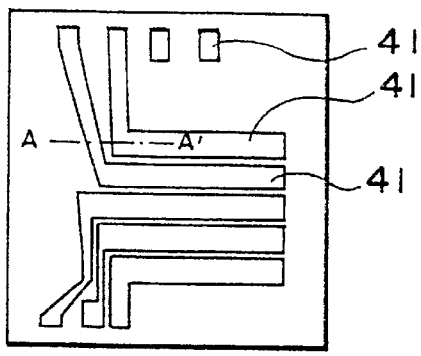
FIG. 12A
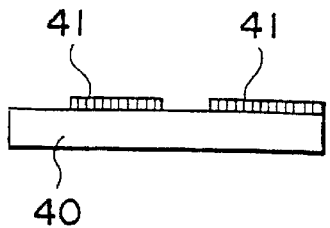
FIG. 12E
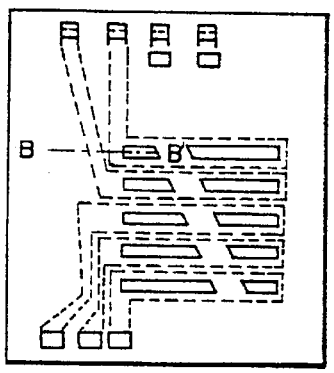
FIG. 12B
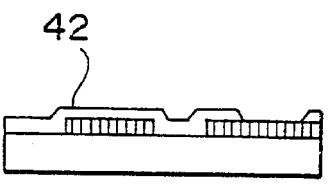
FIG. 12F
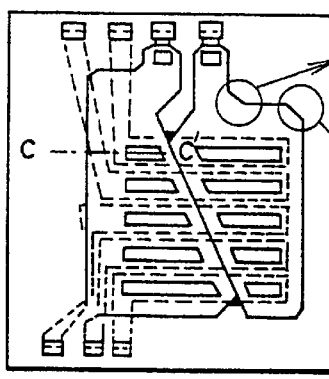
FIG. 12C
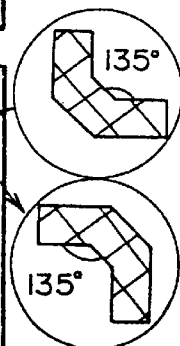
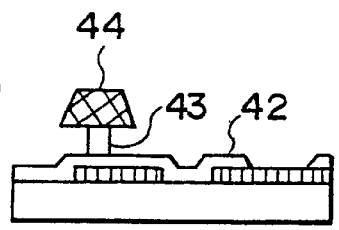
FIG. 12G
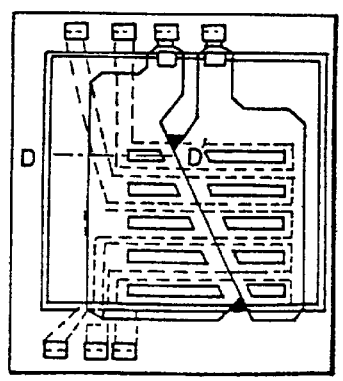
FIG. 12D
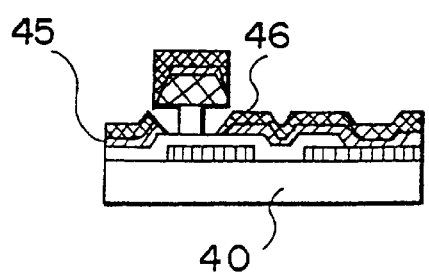
FIG. 12H

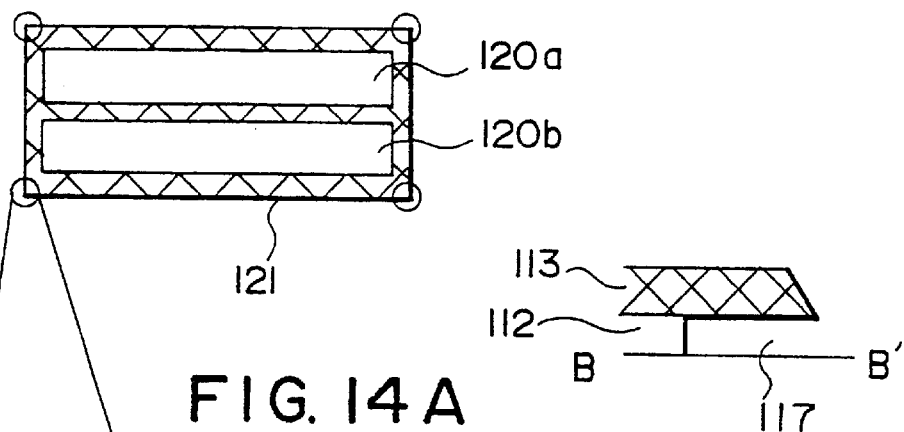
FIG. 14A
FIG. 14B
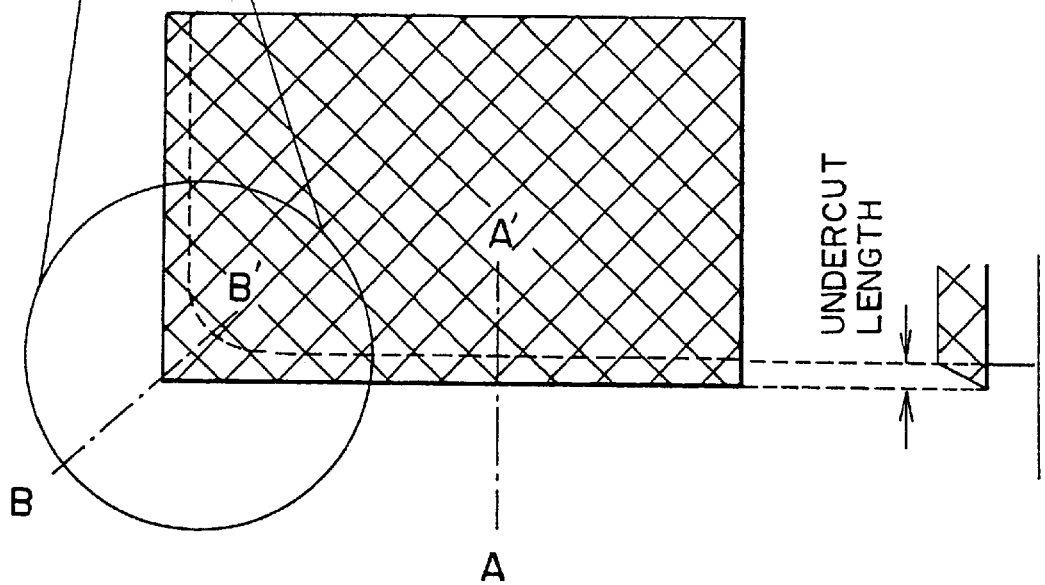
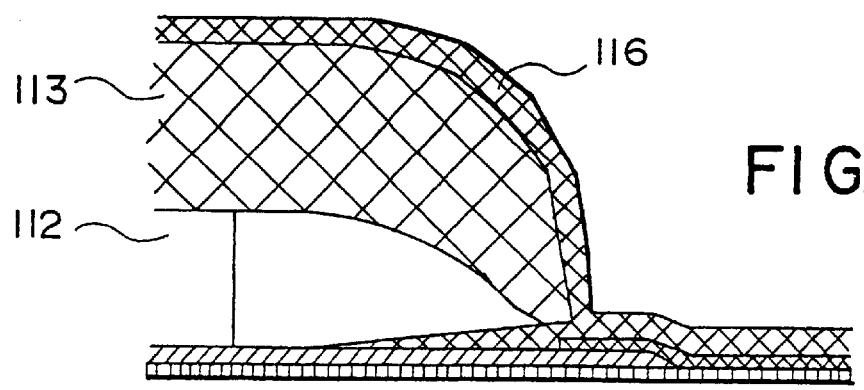
FIG. 14C tris(8-hydroxyquinoline) aluminium polythiophene rubrene 4,4',- bis [(1,2,2-trisphenyl)ethenyl]-biphenyl

ORGANIC ELECTROLUMINESCENCE DISPLAY DEVICE AND PRODUCING METHOD THEREOF

This application is a divisional of prior application Ser. No. 09/274,021, filed on Mar. 22, 1999, U.S. Pat. No. 6,147,442, which is a divisional of prior application Ser. No. 08/834,733, filed on Apr. 3, 1997, U.S. Pat. No. 6,037,712.

BACKGROUND OF THE INVENTION

1. Field of the Invention

The present invention relates to an organic electroluminescence display device which is used as a display device or a light source and which can be formed by a process including photolithography with easy isolation of organic electroluminescence elements, and also relates to a producing method of the above organic electroluminescence display device.

2. Description of the Related Art

At present, liquid crystal display devices are used as thin flat panel displays which are currently the main stream of the technical field of display devices. However, organic electroluminescence (hereinafter referred to as "organic EL") display devices using organic EL elements are superior to liquid crystal display devices in the following points:

(1) Having a wide viewing angle because the organic EL elements emit light by themselves.
(2) Allowing easy manufacture of a thin display device of about 2–3 mm in thickness.
(3) Capable of providing a natural emission color because of no need for using any polarizing plate.
(4) Capable of clear display because of a wide light and shade dynamic range.
(5) Allowing organic EL elements to operate in a wide temperature range.
(6) Easily enabling dynamic image display because the response speed of the organic EL elements is three orders or more higher than that of liquid crystal elements.

In spite of the above advantages, the organic EL display devices have the following problems in manufacture. For example, organic layers constituting the organic EL elements and electrodes containing a metal having a small work function which is usually used as a cathode to inject electrons into the organic layers are easily deteriorated by water and oxygen. Further, the organic layers are easily dissolved by a solvent and are not resistant to heat.

In a manufacturing method using water, organic solvents, and heat, it is difficult to isolate or divide elements after the formation of organic layers and an electrode containing a metal having a small work function. Therefore, when it is intended to form an organic EL display device in the same class as liquid crystal display devices currently implemented, the matured semiconductor manufacturing technology and liquid crystal display device manufacturing technology cannot be applied as they are to isolate small organic EL elements.

In the above circumstance, a method has been proposed in which walls higher than films constituting organic EL films are formed between display line electrodes to be isolated, and materials for forming the organic EL films are vacuum-evaporated in a direction not perpendicular to the substrate surface (i.e., evaporated obliquely). This method utilizes the fact that the materials for forming the organic EL films are not formed in the portions shielded by the high walls. (Refer to U.S. Pat. Nos. 5,276,380 and 5,294,869.)

In the above method, it is very important that the directions in which atoms or molecules travel from the evaporation source to the substrate be aligned. As shown in FIG. 8, in an ordinary evaporation method, an evaporation material is vaporized to assume concentric spheres with an evaporation source 101 in which the evaporation material is set as the center, and then attaches to a substrate 100. The incident angle of the evaporation material with respect to the substrate 100 varies with the position on the substrate 100, and the thickness of a resulting film formed on the substrate 100 varies in response to the distance from the evaporation source 101.

Therefore, it is difficult for the above method to isolate the display line electrodes in a stable manner, and to form the films uniformly over the entire substrate surface. Although the above method could manufacture small-size display devices, in order to apply the above method to medium-size or large-size substrates of the 10-inch class or larger, for example, the distance between the substrate 100 and the evaporation source 101 should be set sufficiently long. In this case, the size of the evaporation apparatus becomes impractical.

Even if such a large evaporation apparatus is produced, a large amount of organic EL material does not reach the substrate surface, and thus is consumed in vain without being formed on the substrate, resulting in a major factor of cost increase.

In general, a substrate is rotated or a plurality of evaporation sources are used to evaporate a thin film uniformly on the substrate. These methods are actually employed in semiconductor device manufacturing processes and liquid crystal device manufacturing processes. However, if the above method of forming high walls is applied to these methods, the element isolation cannot be attained any more.

In the conventional method, the organic EL films and the metal electrodes having a small work function are necessarily exposed unless protecting layers are consecutively formed in the same direction. Thus, it is difficult to completely eliminate the influences of water, oxygen, etc. It is impossible to perform photolithography having a process using an organic solvent or water after formation of the organic EL films.

SUMMARY OF THE INVENTION

An object of the present invention is to provide a highly reliable organic EL display device and a producing method thereof by making the element isolation easier irrespective of the manner of evaporating an organic EL material, enabling the use of a large-size substrate, and completely covering organic EL layers and metal electrodes having a small work function by forming films that are stable with respect to water, oxygen, and organic solvents without exposing those to the air, i.e., in a vacuum.

According to the present invention, there is provided an organic electroluminescence display device comprising: a first electrode which is transparent and formed on a substrate; an insulating film selectively formed on the first electrode; a plurality of spacers formed on the insulating film; an overhanging film which is formed on each spacer and has a width wider than that of each spacer; an organic electroluminescence film formed on the first electrode and between adjacent spacers; and a second electrode formed on the organic electroluminescence film.

According to the present invention, there is provided a method for producing an organic electroluminescence display device, comprising the steps of: forming a first electrode which is transparent on a substrate; selectively forming an insulating film on the first electrode; forming a spacer film on the insulating film; selectively forming a photosensitive film on the spacer film; forming a plurality of spacers by overetching the spacer film, so that the photosensitive film overhangs each spacer; forming an organic electroluminescence film on the first electrode and between adjacent spacers; and forming a second electrode on the organic electroluminescence film.

According to the present invention, there is provided an organic electroluminescence display device comprising: a plurality of organic electroluminescence elements; and an element isolating structure portion which is formed between adjacent organic electroluminescence elements and has an overhanging portion, wherein a bending portion of the element isolating structure portion has a bending angle larger than 90°.

According to the present invention, there is provided an organic electroluminescence display device comprising: a plurality of organic electroluminescence elements; and an element isolating structure portion which is formed between adjacent organic electroluminescence elements and has an overhanging portion, wherein a bending portion of the element isolating structure portion is formed by an arc having a radius of curvature of 5 μm.

According to the present invention, there is provided a method for producing an organic electroluminescence display device having an element isolating structure portion formed between adjacent organic electroluminescence elements, a bending portion of the element isolating structure portion having a bending angle larger than 90°, the method comprising the steps of: forming a first electrode which is transparent on a substrate; selectively forming an insulating film on the first electrode; forming a spacer film on the insulating film; selectively forming a photosensitive film on the spacer film; forming a plurality of spacers overhung by the photosensitive film by overetching the spacer film, to obtain the element isolating structure portion; forming an organic electroluminescence film on the first electrode and between adjacent spacers; and forming a second electrode on the organic electroluminescence film.

According to the present invention, there is provided an organic electroluminescence display device comprising: a first electrode which is transparent and formed on a substrate; an insulating film selectively formed on the first electrode; a plurality of first spacers formed on the insulating film; a plurality of second spacers formed on the first spacers; an overhanging film which is formed on each second spacer and has a width wider than that of each first spacer; an organic electroluminescence film formed on the first electrode and between adjacent first spacers; and a second electrode formed on the organic electroluminescence film.

According to the present invention, there is provided a method for producing an organic electroluminescence display device, comprising the steps of: forming a first electrode which is transparent on a substrate; selectively forming an insulating film on the first electrode; forming a spacer film having a plurality of layers on the insulating film; selectively forming a photosensitive film on the spacer film;forming a plurality of spacers by overetching one layer of the spacer film which is not in contact with the photosensitive film, so that the photosensitive film overhangs each spacer; forming an organic electroluminescence film on the first electrode and between adjacent spacers; and forming a second electrode on the organic electroluminescence film.

BRIEF DESCRIPTION OF THE DRAWINGS

FIGS. 5A–5E and 7A–7B show a manufacturing process of organic EL elements according to a second embodiment of the invention;

FIGS. 9A and 9B are a plan pattern view and a sectional view of light emitting portions of an organic EL display device according to a third embodiment of the invention;

FIGS. 10A and 10B are a plan pattern view and a sectional view of light emitting portions of an organic EL display device according to a fourth embodiment of the invention;

FIGS. 12A–12H are plan pattern views and sectional views of a bar graph portion of the display portion of the organic EL display device according to the fifth embodiment of the invention;

FIGS. 13A–13C and 14A–14C are plan pattern views and sectional views of a light emitting portion of an organic EL display device having element isolating structure portions according to the invention;

DETAILED DESCRIPTION THE PREFERRED EMBODIMENTS

Embodiments of the present invention will be hereinafter described in detail with reference to the accompanying drawings.

Embodiment 1

Figure 1A:
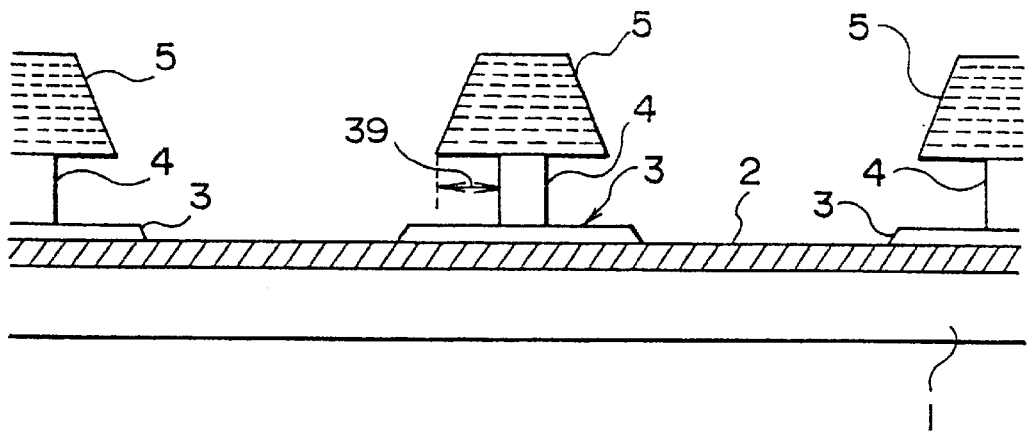
FIGS. 1A and 1B show the structure of an organic electroluminescence (EL) elements according to a first embodiment of the invention.
Figure 1B:
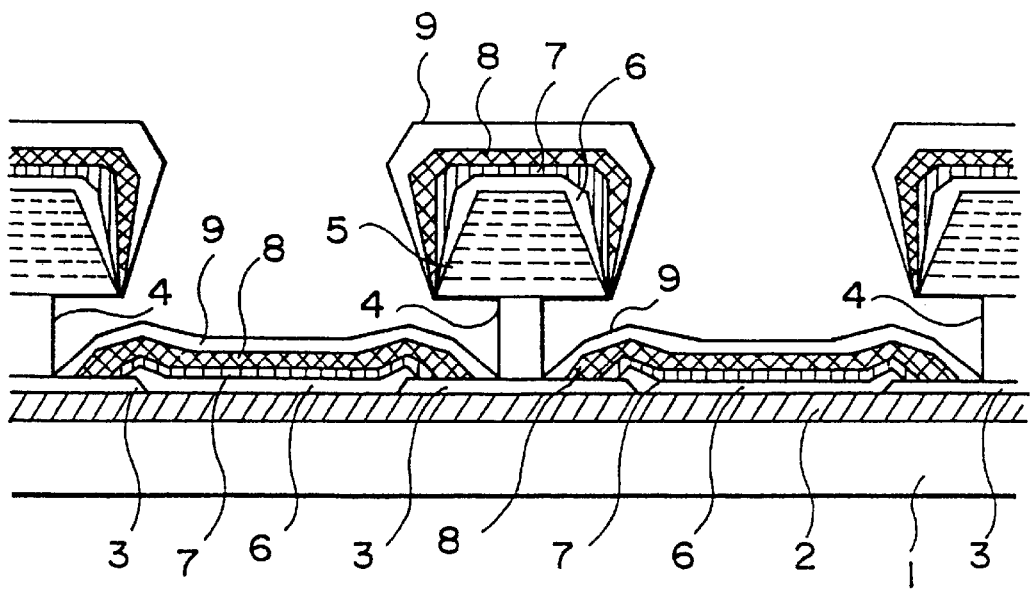

FIGS. 1A and 1B show the structure of organic electroluminescence (EL) elements according to a first embodiment of the invention. As shown in FIG. 1A, a first transparent electrode 2 (for example, an indium tin oxide (ITO) film) is formed on an insulating transparent substrate 1 in a desired pattern shape. Then, an insulating film (for example, a polyimide film or an $SiO_2$ film) is formed on the first transparent electrode 2. Organic EL films and second electrodes contacting with the organic EL films will be formed later to constitute a light emitting portion. A portion of the insulating film located on the display surface side of the light emitting portion is removed.

Next, a spacer film (for example, a polyimide film) constituted of at least one layer is formed. After photosensitive films (photosensitive resin films) such as resists are formed between electrodes to be isolated, photosensitive films 5 on remaining insulating films 3 are left by photolithography. Subsequently, the exposed portions of the spacer film are removed by etching. At this time, the portions of the spacer film under the photosensitive films 5 are also removed to form sufficiently long undercut regions. As a result, with respect to the spacers 4 formed by undercutting, the photosensitive films 5 assumes eaves, hat, or cap-shaped structure, or an overhanging structure in general terms. Thus, element isolating structure portions can be formed.

By forming the element isolating structure portions, when organic EL films 6 which control light emission and carriers and second electrodes 7 directly contacting with the organic EL films 6 are formed by evaporation, as shown in FIG. 1B, the elements can always be isolated irrespective of the positional relationship between the evaporation source and the substrate and the method for improving the uniformity of the films. Thus, a method that regards, as most important, improving the uniformity of the organic EL films 6 formed, such as a rotary method in the case of evaporation, can be selected.

After the organic EL films 6 and the second electrodes 7 directly contacting with the organic EL films 6 are formed in the above manner, metal films 8 made of a stable metal that is hardly affected by water, oxygen, or organic solvents are formed as protecting films for the second electrodes 7. When the organic EL films 6 and the second electrodes 7 are formed by evaporation, the metal films 8 are formed by a method (for example, sputtering) that provides resulting films with better step coverage than evaporation.

The protecting film may be any of a metal film of a stable metal such as aluminum (Al), an insulating film such as an $SiO_2$ film, and a combination of an Al film and a second protecting film 9 such as an $SiO_2$ film formed thereon (see FIG. 1B). The second protecting film 9 protects the organic EL film 6, the second electrode 7, the metal film 8, and other films.

Figure 2:
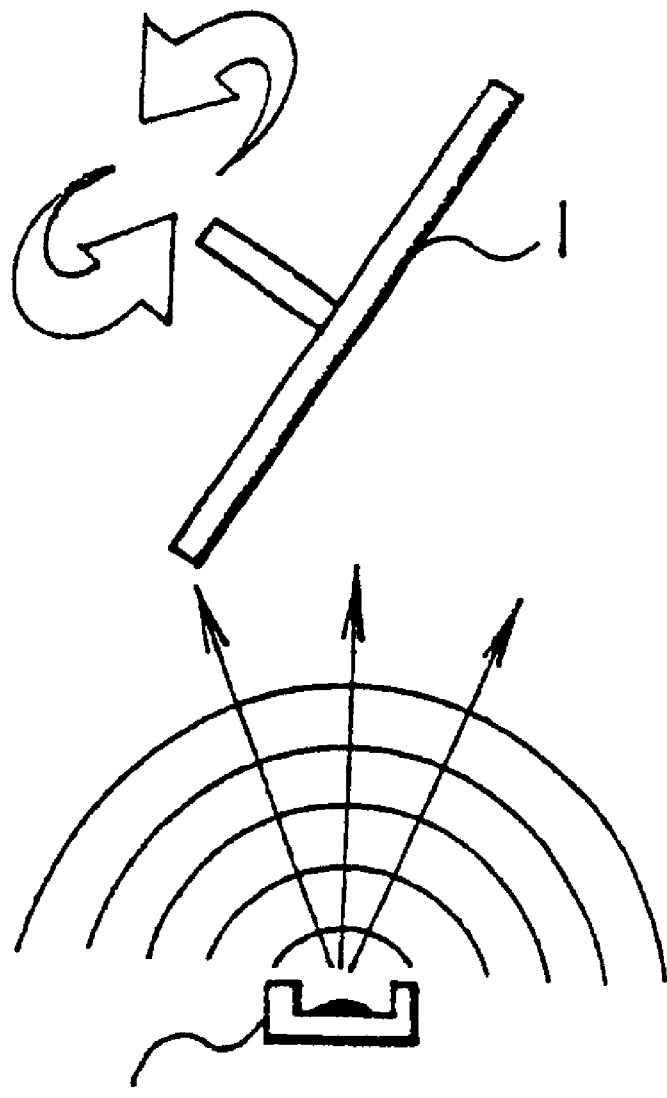
FIG. 2 is a diagram explaining rotary evaporation.

It is desirable to form the protecting film subsequently to the formation of the organic EL film 6 and the second electrode 7 without being exposed to the air, i.e., with maintaining a vacuum state. For example, the protecting film may be formed by evaporation in a low vacuum or sputtering. A film having good step coverage can be formed by rotating the substrate 1 while it is considerably inclined from the direction of vaporization from an evaporation source 10 as shown in FIG. 2.

Thus, the structure of FIG. 1B is obtained in which even the end portions of the organic EL films 6 and the second electrodes 7 are not exposed by forming the metal films 8 as the protecting films or the metal films 8 and the second protecting films formed thereon so that they are also formed in the above undercut regions. Since the organic EL films 6 are completely enclosed by the first transparent electrodes 2, the insulating films 3, and the metal films 8 (and the protecting films 9), the organic EL elements can resist through a process using water or an organic solvent, such as photolithography that is performed in forming lead out electrodes for the metal electrodes 8.

It is apparent from the above description that it becomes possible to cause the organic EL elements to emit light uniformly, to manufacture a highly reliable organic EL flat panel display at a stable yield, and to increase the flexibility of the manufacturing process of an organic EL flat panel display.

The first embodiment of the invention will be described in more detail. FIGS. 3A–3J and 4A–4C show a manufacturing process of the organic EL elements according to the first embodiment of the invention. This process is directed to a case of manufacturing a 2-row/16-column dot matrix type display device in which the 1-dot pixel size is 0.4 mm×0.6 mm and the character display area is 5×8 dots.

An inexpensive soda glass substrate, which is used in amorphous silicon (a-Si) solar cells, super twisted nematic (STN) liquid crystal display devices, etc., is used as the substrate of the organic EL display device. The entire surface of the glass substrate is coated with silica ($SiO_2$). The silica coating prevents sodium elution from the glass substrate when it is heated, protects the soda glass substrate which is not resistant to acids and alkalis, and improves the flatness of the glass substrate surface. For example, the silica coating is performed by immersing the glass substrate in a $SiO_2$ solution or by spin on glass (SOG) coating for the glass substrate.

Next, an ITO film which is a transparent conductive Film as a first electrode is formed at a thickness of about 1,500 angstrom by sputtering on the glass substrate. The use of the ITO film is due to the fact that it exhibits superior characteristics to films made of other materials when it is used as a transparent conductive film. However, a transparent electrode of a ZnO film, an $SnO_2$ film, or the like may be used if it has transmittance and resistivity, for example, that will not cause any problem during use. When the ITO film is formed over a large area, sputtering is advantageous in uniformity and film quality of a resulting film as well as productivity. However, the ITO film need not always be formed by sputtering, and may be formed by evaporation, for example.

Figure 3A:
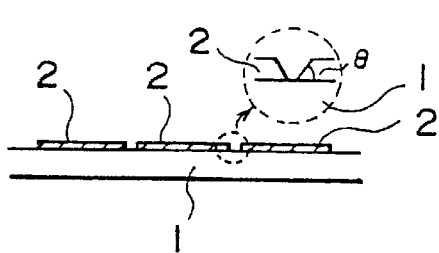
FIGS. 3A–3J and 4A–4C show a manufacturing process of the organic EL element according to the first embodiment of the invention.
Figure 3B:
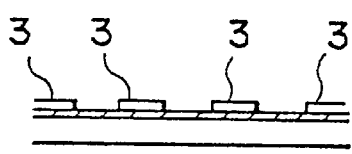
Figure 3C:
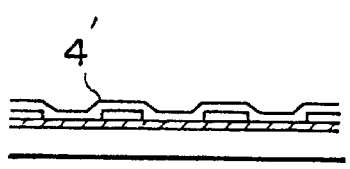
Figure 3D:
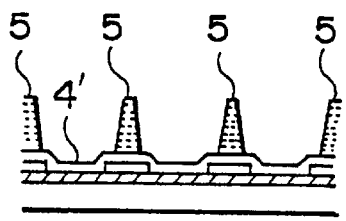
Figure 3E:
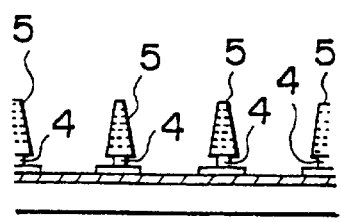
Figure 3F:
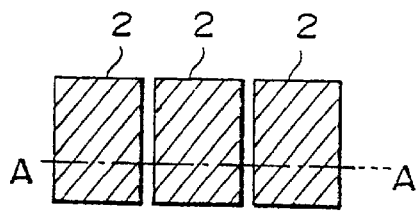
Figure 3G:
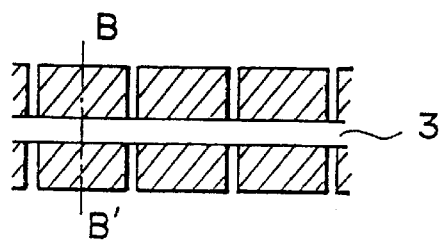

As shown in FIGS. 3A and 3F, after the ITO film is formed on the silica-coated substrate 1 (the silica coating film is not shown), a resist pattern (not shown) is formed on the ITO film by photolithography. After unnecessary portions of the ITO film are removed by etching to form the ITO film into a desired electrode pattern, the resist pattern is removed. As shown in FIG. 3A in enlarged form, it is desired that the ends of the ITO films 2 be tapered. This is to prevent, in the step portions of the ITO films 2, step disconnection of organic films and second electrodes to be evaporated in later processes, to thereby improve the yield and life of the organic EL elements. It is desired that the taper angle be 45° or less. Incidentally, FIGS. 3F–3J are plan views of element patterns, and FIGS. 3A–3E are sectional-views taken along dot-chain lines A–A', B–B', C–C', D–D', and E–E' in FIGS. 3F–3J, respectively.

Steps having a small taper angle can be formed by wet etching or dry etching. For example, in wet etching, since the etching proceeds isotropically, a taper angle of about 45° can naturally obtained if the overetching time is not set too long. Also, in dry etching, a taper angle of 20° to 30° can easily be obtained by utilizing retreat of a resist due to the etching, that is, by selecting etching conditions such as a dry etching gas, high frequency (e.g., RF) power and a gas pressure so that a taper angle of the resist is transferred. The etching gas for this purpose includes gases of hydrogen halides such as hydrogen chloride and hydrogen iodide, a bromine gas, and a methanol gas.

Films for disposing spacers to be formed in a later process are formed on the ITO films 2. Any insulating film may be used as such films. The films may be formed by various methods: forming inorganic thin films such as $SiO_2$ films or $SiN_x$ films by sputtering or vacuum evaporation, forming $SiO_2$ films by SOG coating, and applying resist, polyimide, acrylic resin or the like. Since it is necessary to expose a portion of the ITO films 2 formed under the insulating film, the insulating film needs to be patterned without damaging the ITO films 2. Although there is no limitation on the thickness of the insulating films, when an inorganic thin film is used, the manufacturing cost can be reduced by decreasing the thickness thereof.

It is desirable that the ends of the insulating films 3 formed above the ITO film 2 be also tapered. The taper angle should be about 60° or less, preferably 45° or less. When $SiO_2$ films are formed as the insulating films 3, a taper angle of 45° can be obtained by wet etching if the overetching time is not set too long. To make the taper angle even smaller, dry etching is suitable as in the case of forming the ITO films 2. A carbon fluoride type etching gas such as $CF_4+O_2$ is generally used.

In this embodiment, polyimide is used to form the insulating films 3. Non-photosensitive polyimide to be prepared is diluted to about 5% with N-methyl pyrrolidone (NMP) or γ-butyrolactone. Such polyimide is applied by spin coating and then prebaked at 145° C. for one hour. After a positive resist is applied, patterning is performed to form a structure shown in FIGS. 3B and 3C.

Exposed portions of the resist and corresponding portions of the polyimide film are removed sequentially with an aqueous solution of tetra methyl ammonium hydroxide (TMAH) having a concentration of about 2.38%. The TMAH is a developer for the resist. Further, only the remaining portions of the resist are removed by ethanol, to form desired insulating films. Although the above description is directed to the case of using non-photosensitive polyimide, photosensitive polyimide may also be used. In this case, no resist is needed.

The polyimide insulating films 3 thus obtained are completely cured at about 350° C. to prevent them from being affected by a chemical solution. Since the insulating films 3 contract in this process, their steps come to be tapered.

When the step shape of the ITO films 2 is hard to control in the above manner, the photomask may be so designed that the insulating films 3 formed in this process also cover the step portions of the ITO films 2.

Subsequently, a spacer film to be used as spacers 4 (see FIG. 1A) is formed. Because of their purpose, the spacers 4 may be either a conductor or an insulator, and have either a single layer or a multilayer structure. However, when the spacers 4 are a conductor, there is a possibility that metal films formed in a later process cause a short circuit or a current leak between adjacent display lines via a spacer. This problem may be solved by making the undercut amount in etching the spacer film sufficiently large.

The spacer made of a metal has the following advantages. (1) Since the spacer is sufficiently strong and malleable, the elements that are easily rendered faulty due to she existence of dust can sufficiently be cleaned with ultrasonic waves, for example. (2) Since the spacer is more resistant to heat than a resist etc., dehydration can be effected by heat treatment. (3) Since the spacer is hardly charged, particles are less likely to attach to the spacer. (4) When a short circuit occurs in an element circuit due to dust, the spacer can be burnt off.

It is necessary to select an etching material for the spacer film which neither etches nor affects the ITO films 2 that are in contact with the spacer film in etching the spacer film. Also, since the spacer film is used to form the spacers 4, it should be so formed as to be thicker than a total thickness of all of the organic EL film 6, the second electrode 7, the metal film 8, the protecting film 9, and other films, as shown in FIG. 1B. Thus, it is desirable that the spacer film be made of a material which allows easy formation of a thick spacer film. As such a material film, an SOG film and a resin film are used. When the spacer film is made of a metal material, a laminate structure of a Cr film, a Ti film, a TiN film, or other film as an etching barrier film for the ITO films 2 and an Al film or other film which has a high formation rate may be formed. The etching barrier film is not limited to a metal material.

Figure 3H:
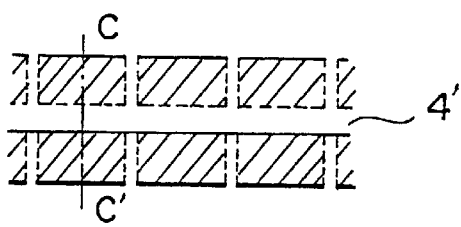

When the spacer film is made of polyimide, polyimide whose concentration has adjusted to 15% is spin-coated at a thickness of 2 $\mu$m, and then prebaked at 145° C. for one hour to form a spacer film 4' (see FIGS. 3C and 3H). The thickness of the spacer film 4' can be adjusted by the polyimide concentration and the rotational speed of the spin coater.

After the formation of the spacer film 4', a positive resist is applied. When the thickness of the positive resist is 1 $\mu$m or more, desirably 2 $\mu$m or more, a highly viscous resist is used or the rotational speed of one spin coater is set low.

Figure 20:
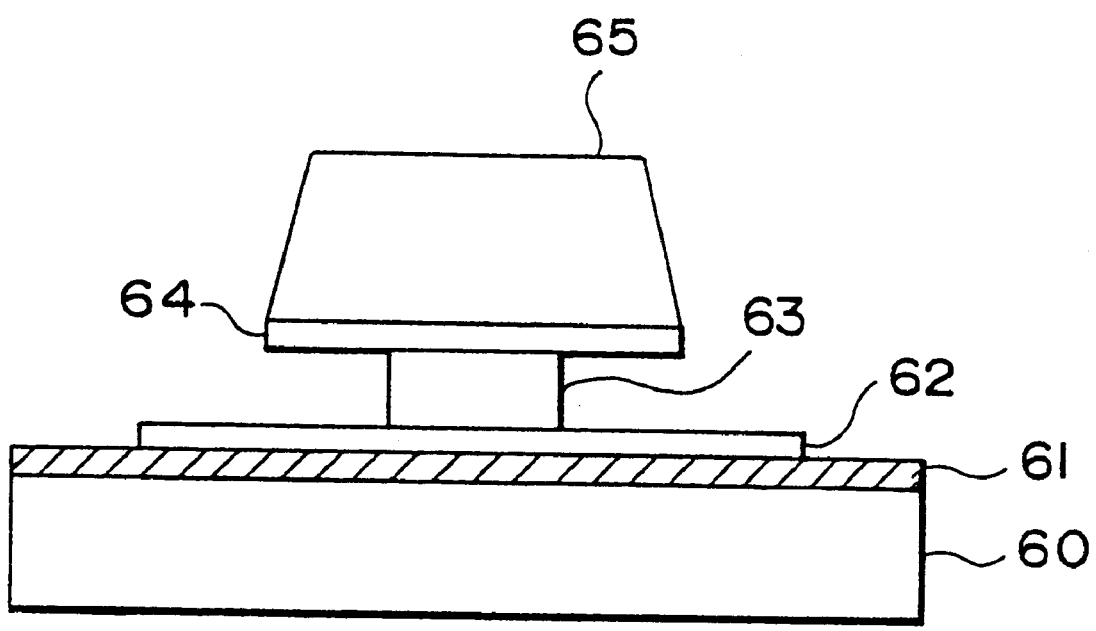
FIG. 20 shows an organic EL element according to the invention with a harder film which is used as a support film.

Since the positive resist is relatively fragile, the method of forming a thick resist is used in this embodiment. However, as shown in FIG. 20, no such method is needed if a harder film (a second spacer) 64 is formed under the resist 65 to support the resist 65. The use of the harder film 04 as a support film has another advantage that heat treatment for eliminating water can be performed in a later process. Conversely, if heat treatment is performed without forming the support film, the resist becomes likely to be deformed and undercut regions may be broken. Note that in FIG. 20, numeral 60 is a substrate, 61 is an ITO film, 62 is an insulating film, and 63 is a spacer (a first spacer).

A conductor such as Cr, Ti, TiN, W, Mo, Ta, ITO, $SnO_2$ or ZnO, an inorganic insulator such as $SiN_x$, $SiO_2$, diamond like carbon (DLC), $Al_2O_3$, $Ta_2O_5$, or glass, a semiconductor such as Si or SiC, or other materials can be used to form the harder film 64.

The harder film 64 can be formed by sputtering, vacuum evaporation, plating, plasma chemical vapor deposition (CVD), thermal CVD or the like. In the spacer formed by a thin film having a plurality of layers, when one layer which is in contact with a photosensitive material constituting the resist is not overetched, it can be used as the support film for the photosensitive material. The photosensitive material can be removed, and in this case a substrate can be baked at a heat resistant temperature of the photosensitive material or a higher temperature. Thus, it is advantages in the case that dehydration process for a substrate can be performed.

Figure 3I:
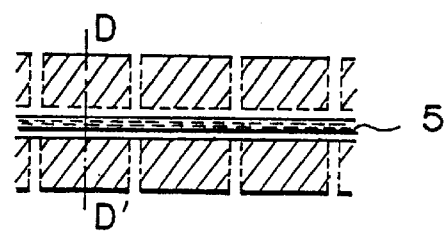
Figure 3J:
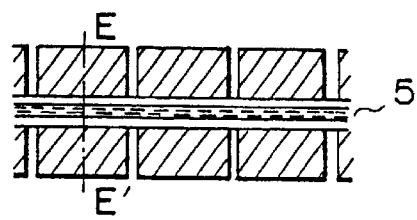

As described above, by applying the positive resist and then performing exposure and development to form a desired photopattern, cap-shaped (an overhanging structure in general) photosensitive films (photosensitive resin films) 5 are formed as shown in FIGS. 3D and 3I. The portions of the polyimide spacer films 4 which are exposed when the positive resist is developed are subsequently removed by using the developer, to form spacers 4 as shown in FIGS. 3E and 3J.

The development time is determined in accordance with the undercut amount (i.e., undercut length) of the polyimide spacer film 4'. The undercut amount is greatly influenced by the polyimide prebaking temperature and time. In particular, the prebaking temperature needs to be controlled so as to make the thickness of the spacer film 4 uniform over the entire substrate surface. In this embodiment, the development time is so controlled that the undercut length becomes about 4 $\mu$m. Thus, a structure shown in FIG. 3E is formed. Note that in FIG. 1A, an undercut length 39 is a length from the side surface of the spacer 4 to the lower edge of the photosensitive film 5.

Figure 4A:
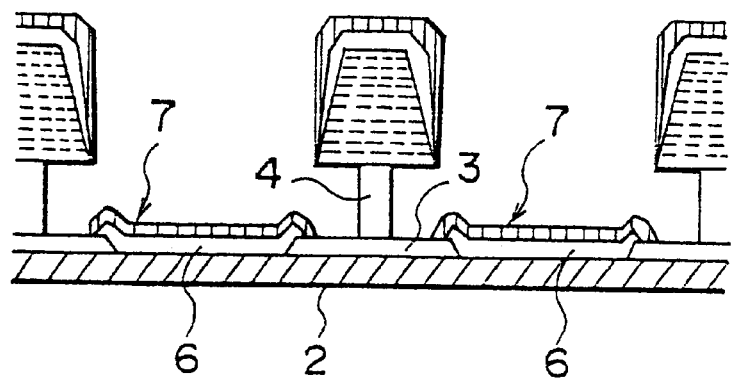
Figure 15:
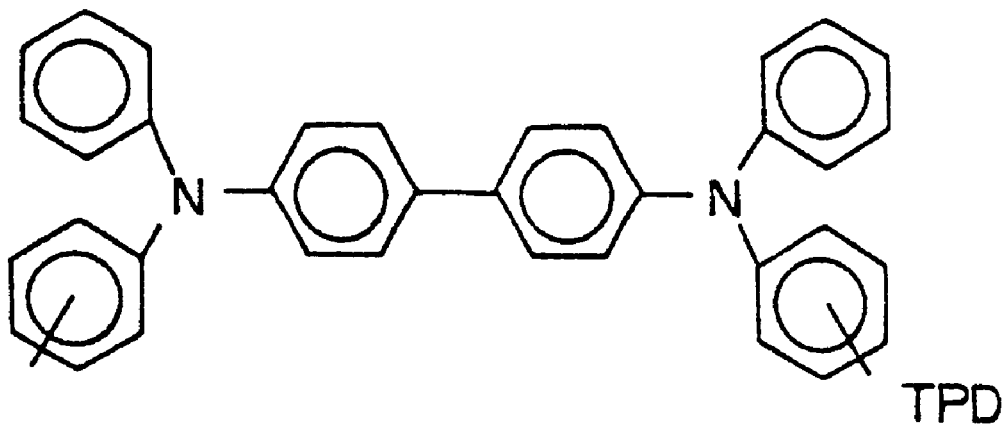
FIG. 15 shows the chemical structural formula of N,N'-bis(m-methyl phenyl)-N,N'-diphenyl-1,1-biphenyl-4,4'-diamine.
Figure 16:
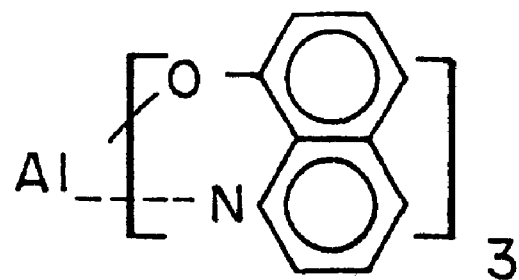
FIG. 16 shows the chemical structural formula of tris(8-hydroxyquinoline) aluminium.

A structure shown in FIG. 4A is formed by consecutively evaporating, without exposure to the air, i.e., in a vacuum, N,N'-bis(m-methyl phenyl)-N,N'-diphenyl-1,1'-biphenyl-4, 4'-diamine (hereinafter referred to TPD; see FIG. 15) as a hole injection layer/hole transport layer of the organic EL film 6, tris(8-hydroxyquinoline) aluminum (hereinafter referred to Alq$_3$; see FIG. 16) as a light emitting layer/electron transport layer of the organic EL film 6, and an Mg/Ag alloy (weight ratio: 10:1) film as the second electrode 7. The thickness of each of the TPD layer and the Alq$_3$ layer constituting the organic EL film 6 is 500 angstrom and the thickness of the Mg/Ag alloy film constituting the second electrode 7 is 2,000 angstrom.

In the invention, the constituent films of the organic EL element and the order of laying those films are not limited to those of this embodiment. The hole injection layer, the light emitting layer, and the second electrode may be made of materials other than the above ones. A hole injection layer, an electron transport layer, an electron injection layer, and other layers may additionally be formed to provide multilayer structures.

In order to form the organic EL films 6, the second electrodes 7, and other layers only on the light emitting portion (i.e., display screen portion), the evaporation is performed by using a metal mask that is mounted on a substrate holder of an evaporation apparatus.

Figure 4B:
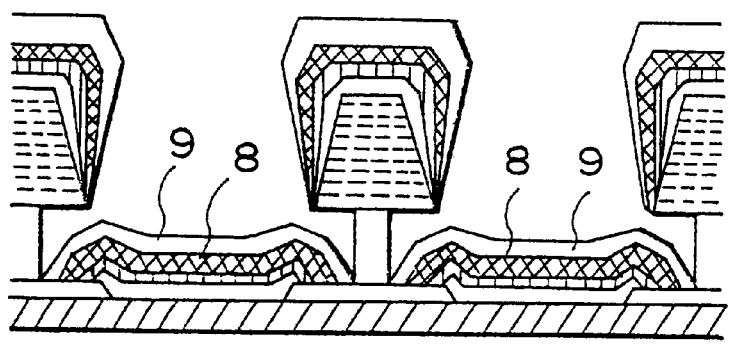

As shown in FIGS. 4A and 4B, after the formation of the organic EL films 6 and the second electrodes 7, the substrate is transferred without exposing to the air, i.e., in a vacuum, to a vacuum chamber capable of film formation by sputtering, so that the metal films 8 such as Al films are formed by sputtering. In this process, it is important that the metal films 8 be formed by a method that can provide superior step coverage to the method by which the organic EL films 6 having organic EL layers are formed. In this manner, the Al films are also formed in the undercut regions, so that the organic EL films 6 which are not resistant to water and oxygen are completely shielded from the air.

The above process provides a notable advantage that the organic EL films 6 can be shielded from an organic solvent used in etching, as well as from water and oxygen. In the conventional structure, the entire organic EL film is removed by an organic solvent that has soaked into it from an exposed portion of the film at an end portion of the pattern, for example. Thus, once the organic EL film is formed, it is prohibited to be in contact with any organic solvent, which restrict the kinds of usable manufacturing processes. In contrast, the invention allows use of a variety of manufacturing processes.

To further improve the resistance to water and an organic solvent, the protecting films 9 such as SiO$_2$ films may be formed as shown in FIG. 4B after the metal films 8 made of a stable metal such as aluminum are formed.

In this embodiment, Al films are formed at a sputtering pressure of $8 \times 10^{-3}$ torr. The sputtering pressure is desired to be as high as possible. This is because if the sputtering pressure is higher, Al atoms emitted from the Al target to various directions more likely collide with argon atoms and are scattered, so as to go into the undercut regions more likely, whereby the organic EL films 6 are sufficiently covered with the Al films. That is, the mean free path of Al atoms should be shorter than the distance between the target and the substrate. On the other hand, if the sputtering pressure is high, the formation rate decreases due to a reduction in the voltage applied to the target and the scattering of Al atoms. Thus, the sputtering pressure is determined by a balance between the productivity and the step coverage.

Although in this embodiment the metal films 8 of a stable metal such as aluminum are formed by sputtering, the invention is not limited to such a case. For example, similar advantages are obtained by methods capable of providing good step coverage such as a method in which evaporation is performed in a low vacuum with introduction of an inert gas, plasma CVD, and photo-assisted CVD. The same methods apply to the formation of the SiO$_2$ films as the protecting films 9.

By the way, when lead out Al electrode pads (not shown) are formed to connect a control integrated circuit (IC) to the metal films 8 which are in contact with the second electrodes 7, the lead out Al electrode pads are arranged at side portions of the display portion so as not to cause defect portions on the display portion. To prevent the constituent films of the organic EL elements and the SiO$_2$ films from being formed below and above the Al electrode pads, respectively, the Al electrode pads are shielded by the metal masks in forming the constituent films of the organic EL elements 6 and the SiO$_2$ protecting films. This is to improve the adhesiveness between the Al electrode pads and the substrate and to prevent insulating films from being formed on the Al electrode pads. In plasma CVD and photo-assisted CVD which are much superior in coverage performance, the SiO$_2$ films may be formed on the Al electrode pads even if the metal masks are used. In such a case, connection holes reaching the Al electrode pads may be formed by photolithography.

When insulating films such as SiO$_2$ films are formed as the protecting films 9 in the final process, even if the resist films, i.e., the photosensitive films 5 are broken by mechanical pressure, the respective display lines would be still covered with the protecting films 9. Thus, if only the resist in the vicinity of the Al electrode pads on which no insulating film is formed is wiped off by using a solvent, failures such as a short circuit via constituent films of the organic EL elements will not occur without removing the constituent films remaining on the resist in the vicinity of the display lines. The elimination of the process of removing the cap-shaped resist remaining over the entire substrate surface is advantageous in the manufacturing cost.

To provide more reliable organic EL elements by protecting the organic EL films from physical contact, pollution, etc., it is desirable to attach a glass substrate or the like to the organic EL elements from above (i.e., from the opposite side of a display surface). However, in such a case, a solvent contained in an adhesive dissolve the resist films, i.e., the cap-shaped photosensitive films (photosensitive resin films) to possibly cause a short circuit between adjacent organic EL elements if insulating films as the protecting films are not formed in the final process. Thus, when the glass substrate or the like for protection is attached to the organic EL elements from above, it is desirable to remove in advance the constituent films of the organic EL elements and Al films remaining on the photosensitive resin films. These films can easily be removed by immersing them in a chemical solution that can dissolve the photosensitive resin films or the spacers. Pi structure shown in FIG. 4C can be formed by removing only the photosensitive resin films by using an alcohol such as ethanol or isopropyl alcohol, an ester such as butyl acetate or ethyl acetate, or an organic solvent such as acetone or xylene.

Both the spacers 4 and the photosensitive resin films can be removed by using a resist removing solution such as NMP, γ-butyrolactone, or type number MS-2001 of Fuji Hant Co., Ltd. which is on the market. In this case, the thin films formed on the photosensitive resin films are lifted off. By removing also the spacers 4, the thin films on the photosensitive resin films 5 can easily be lifted off. Thus, this process is easy on manufacture.

Figure 4C:
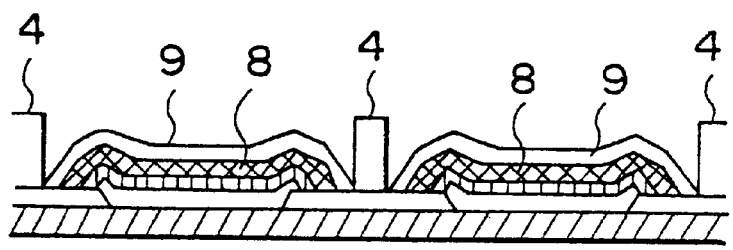

If the spacers 4 are left as shown in FIG. 4C, they can be used as posts. That is, when the substrate for protection is attached as described above, since it is not in contact with the organic EL elements because of the existence of the spacers 4, physical influences of the substrate on the organic EL elements can be lowered and it is advantageous on the prolongation of the life of the organic EL elements.

In this manner, the manufacturing process and the structure of the organic EL elements may be determined in accordance with the purpose of manufacturing the organic EL display device, that is, depending on which of the manufacturing, cost and the life is important.

In this embodiment, only the photosensitive resin films 5 are removed and the spacers 4 are left as shown in FIG. 4C. Also, to further improve the water resistance, carbon fluoride polymer films (not shown) are formed on the protecting films 9 by plasma CVD. Film forming gases of $CF_4$ and $CHF_3$ to be used are decomposed at a gas pressure of 100 m torr to form the carbon fluoride polymer films. Since plasma CVD provides better coverage performance than sputtering, it is difficult to lift off the photosensitive resin films 5 on the spacers 4 once the carbon fluoride polymer films are formed.

The portions of the carbon fluoride polymer films formed on the Al electrode pads are removed by photolithography using enzyme plasma, and then the resist is removed. Thus, a desired organic EL display device is completed.

In the organic EL display device thus manufactured which is superior in the resistance to water and an organic solvent, the display lines are independent of each other and the organic EL films are completely covered with the stable thin films. Thus, it has been confirmed that the organic EL display device of this embodiment is as reliable as organic EL display devices constituted of conventional organic EL elements which operate in a vacuum or a dried nitrogen atmosphere.

Embodiment 2

FIGS. 5A–5E and 7A–7B show a manufacturing process of an organic EL display device according to a second embodiment of the invention. The second embodiment is directed to the process of manufacturing a simple matrix (multiplex) type display device in which one pixel size is 330 $\mu$m×110 $\mu$m, the number of pixels is 320×240×3 (RGB) dots, and color filters are provided. In comparison with the first embodiment, in this embodiment, a higher resolution display device is manufactured and color filters are formed in advance.

Figure 6:
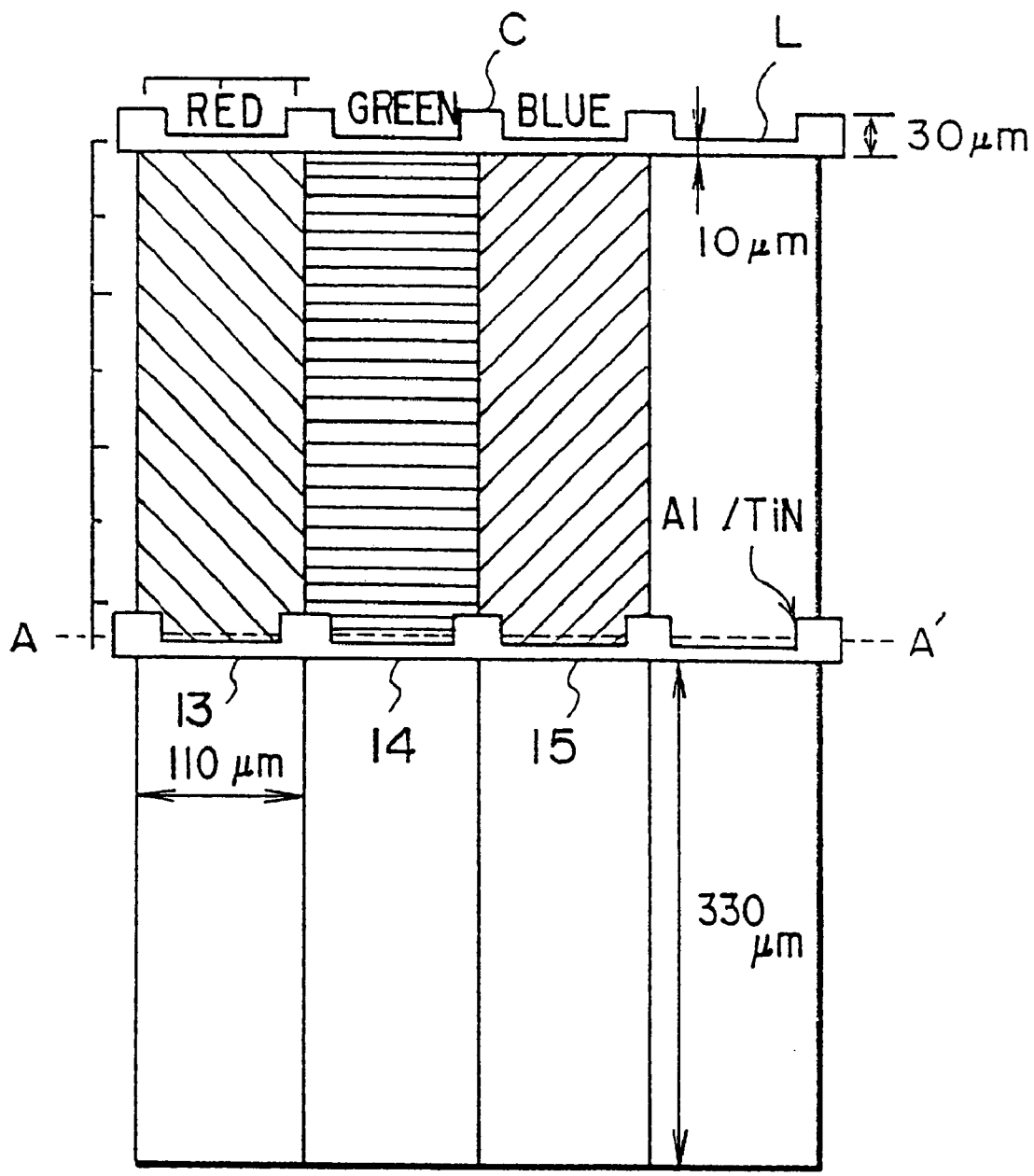
FIG. 6 is a plan view of a color filter port In of an organic EL display device according to the second embodiment of the invention.
Figure 8:
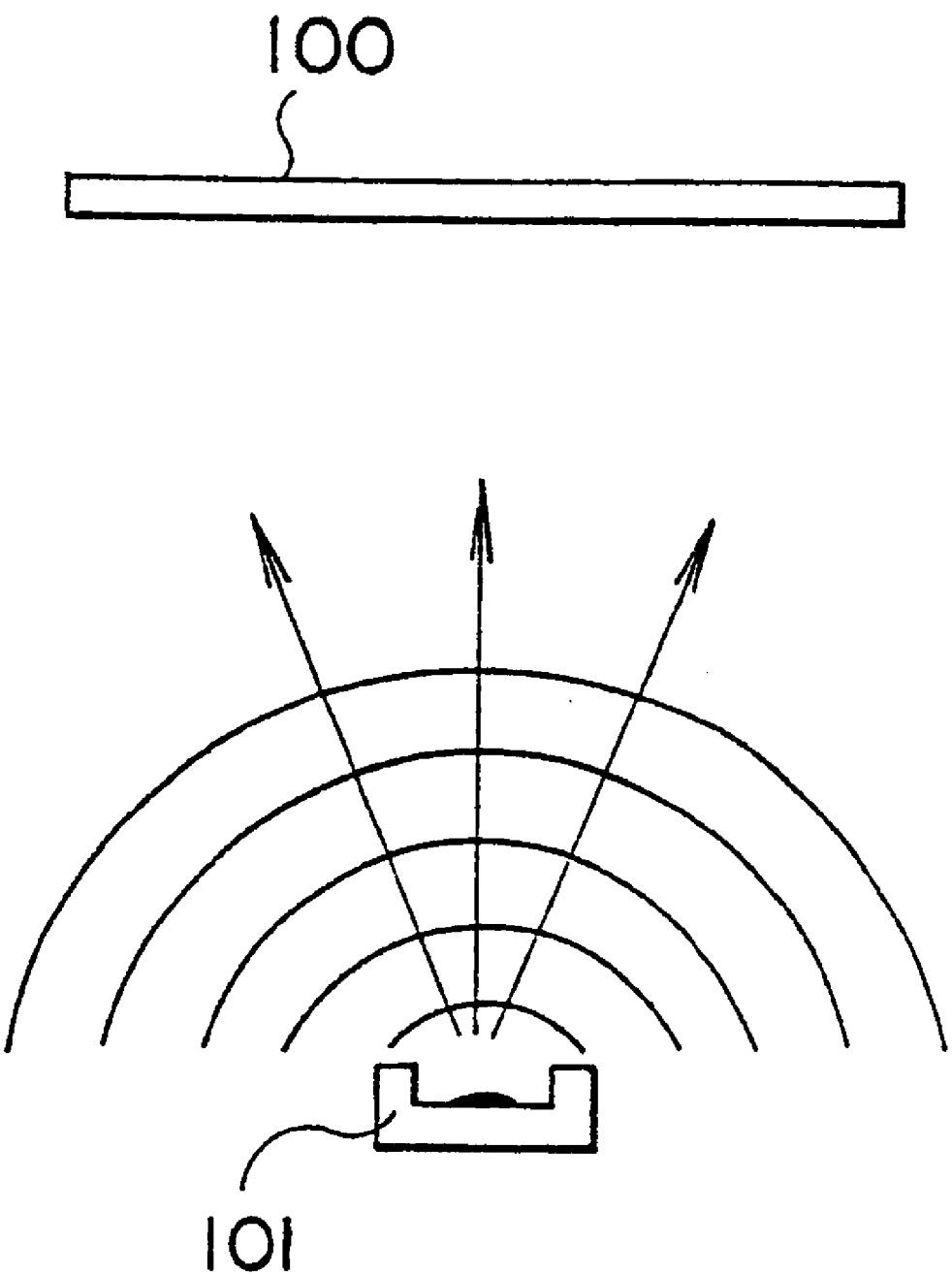
FIG. 8 is a diagram explaining an ordinary evaporation method.

FIG. 6 is a plan view of a color filter portion of the organic EL display device according to the second embodiment of the invention, in which the top-right block and the bottom blocks are drawn in white to describe dimensions of color filters. One pixel has a size of 330 $\mu$m×110 $\mu$m. A TiN film and an Al film are shown as connecting portions C to ITO films which portions have a size of 30 $\mu$m×30 $\mu$m and a line L having a width of 10 $\mu$m. FIGS. 5A–5E and 7A–7B are sectional views taken along a dot line A–A' in FIG. 6.

As the resolution increases, the electric resistance of transparent conductive films such as ITO films more likely causes a problem. To solve this problem, the Al films, whose resistivity is about 1/100 of that of the transparent conductive films, are used to form a laminate structure with the transparent conductive films, to thereby reduce the resistance value. Since direct contact between the Al film and the transparent conductive film causes a large contact resistance, it may be better to form a TiN film, a Cr film, or other film between those films.

An Al film of about 1.5 $\mu$m in thickness is formed on a transparent substrate (not shown) such as a glass substrate by sputtering. Immediately thereafter, a TiN film of about 300 angstrom in thickness is formed thereon by sputtering. Thus, a laminate film of the Al film and the TiN film is formed. If the Al film and the TiN film are formed in succession without being exposed to the air, i.e., in a vacuum, a native oxide film can be prevented from being formed on a surface of the Al film, so that good contact is obtained between the Al film and the TiN film. Instead of the Al film, an Al alloy film containing an element other than aluminum may be used. To prevent uneven portions (hillocks) from being formed on the surface of the Al film due to crystal growth of aluminum in a later heat treatment process, it is in many cases desirable to use an Al alloy film containing scandium (Sc) or the like.

The laminate film of the Al film and the TiN film is then patterned by photolithography to obtain Al films 11 and TiN films 12 formed thereon as shown in FIG. 5A. To obtain a high throughput and a good processed shape, the TiN film and the Al film are etched at the same time by dry etching.

The dry etching is reactive ion etching (RIE) in which the electric power is 2,000 W, the gas pressure is 100 m torr, and etching gases are $Cl_2$ and $BCl_3$. After the etching, ashing is performed without exposure to the air, i.e., in a vacuum. This is to prevent corrosion of aluminum after the dry etching, which is called "after-corrosion." Wet etching may be performed because a poor processed shape does not cause any serious problems.

To form color filters, a pigment dispersion type color filter application/formation process is performed which is most commonly employed as a coloring manner for liquid crystal displays. Application conditions for forming RGB (red, green, blue) filters at a thickness of 1.0–2.5 $\mu$m are determined. In FIG. 5B, red filters 13, green filters 14, and blue filters 15 are patterned to expose the surfaces of the TiN films 12.

For example, the application/formation process of the red filters 13 is as follows. After a red filter solution is applied by spin coating at 1,000 rpm (revolutions per minute) for about 5 seconds, prebaking is performed at 100° C. for 3 minutes. Then, a photomask is positioned by using an exposing apparatus, and ultraviolet light of 20 mW/cm$^2$ is irradiated for 30 seconds. Subsequently, development is performed with an about 0.1% TMAH aqueous solution. The development time is about one minute. Further, thermal curing is performed at 220° C. for one hour so that the red filters 13 thus formed will not be dissolved by filter solutions of the other colors (green and blue) to be applied in the later processes.

Because of the use of different pigments, the conditions for forming the green filters 14 and the blue filters 15 are somewhat different from those for forming the red filters 13. However, the green filters 14 and the blue filters 15 may be formed sequentially by approximately the same processes as the processes for forming the red filters 13. Thus, the red filters 13, the green filters 14, and the blue filters 15 are formed as shown in FIG. 5B.

Although this embodiment relates to the case of forming only the color filters because it can be manufactured relatively easily, the invention is not limited to such a case. For example, fluorescence conversion filters may be used to output green light and red light through color conversion, to provide more intense light. Further, a laminate structure of color filters and fluorescence conversion filters may be formed to prevent reduction in brightness while improving the purity of colors.

In order to improve the flatness of the forming surface of an ITO film to be formed in a later process, an overcoat material such as polyimide or acrylic resin is applied to the red filters 13, the green filters 14, and the blue filters 15, and then patterning is performed to expose the surfaces of the TiN films 12. Also, thermal curing is performed at about 220° C. for one hour, to form overcoat layers 16 as shown in FIG. 5C.

After the formation of the overcoat layers 16, an ITO film as a transparent conductive film is formed at a thickness of about 1,400 angstrom by sputtering. Further, a resist pattern is formed by photolithography, and then the ITO film is etched with dilute hydrochloric acid. The resist is removed to form an ITO film 17 (see FIG. 15D). Therefore, a pattern in which the transparent conductive film and the Al film wiring that is formed to reduce the resistance are connected to each other is formed to constitute a display line (column line).

An $SiO_2$ film as an insulating film is formed on the patterned ITO film 17 by sputtering, and then patterned to remain in the regions other than the regions where light emitting portions are seen from the side of the glass substrate (not shown), so that $SiO_2$ films 18 are formed (see FIG. 5E). By the structure in which the ITO film 17 is covered with the $SiO_2$ films 18, useless light emission in the regions not seen from the glass substrate side can be avoided. In addition, since holes or grooves are necessarily formed in these regions, an organic EL film such as a light emitting layer evaporated on an inclined portion may be rendered thin, to possibly form a current leak path. Thus, the formation of the insulating film is desirable.

Although in this embodiment an SiO film is used as the insulating film, the invention is not limited to such a case. Since what is needed is insulation, not only an inorganic insulating film such as an $SiO_2$ film and an $SiN_x$ film but also resin such as polyimide, acrylic resin, and epoxy resin may be used. In patterning the insulating film, if a mask pattern is formed such that insulating films are left also in the regions where spacers are to be formed, a process for forming insulating films under a spacer film can be omitted.

After the patterning of the $SiO_2$ films 18, resist films 20 having a cap-shaped structure (overhanging structure in general) are formed on spacers 19 by processes similar to the processes of FIGS. 3C–3E with a polyimide film used as a spacer film (see FIG. 7A).

For a color display, light emitting elements are constructed by forming the following materials on the structure of FIG. 7A. In this embodiment, organic EL materials are used which emit white light.

Figure 17:
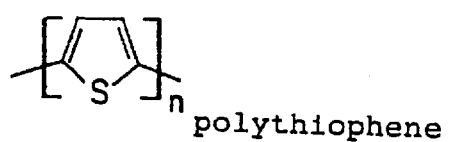
FIG. 17 shows the chemical structural formula of poly (tiophene-2,5-diyl)
Figure 18:
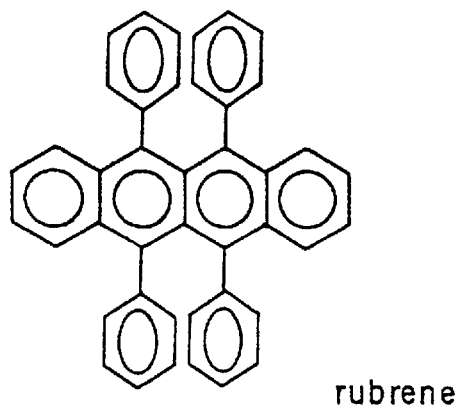
FIG. 18 shows the chemical structural formula of rubrene.
Figure 19:
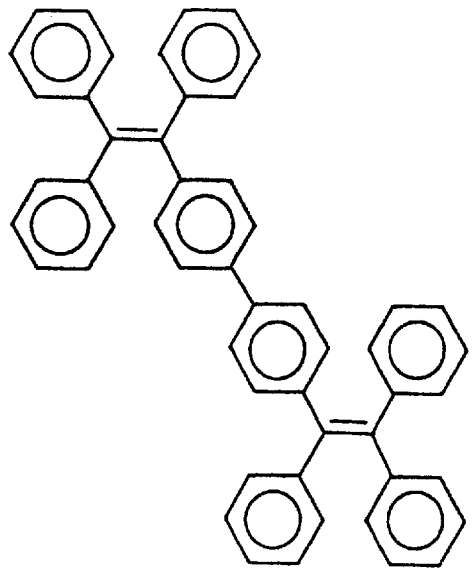
FIG. 19 shows the chemical structural formula of 4,4'-bis [(1,2,2 -trisphenyl)ethenyl]-biphenyl.

To form a yellow light emission organic EL film, polythiophene (see FIG. 17) is evaporated at a thickness of 100 angstrom as a hole injection layer, and then TPD doped with rubrene (see FIG. 18) at 1 weight % is coevaporated at a thickness of 500 angstrom as a hole transport layer/yellow light emission layer. It is preferable that the concentration of rubrene be in a range of 0.1 to 10 weight %, in this range high efficiency light emission is attained. The rubrene concentration, which may be determined in accordance with the color balance of light emission colors, depends on the light intensity and the wavelength spectrum of a blue light emission layer to be formed in a later process. To form a blue light emission organic EL film, 4,4'-bis[(1,2,2-trisphenyl) ethenyl]-biphenyl (see FIG. 19) is evaporated at a thickness of 500 angstrom as a blue light emission layer, and then $Alq_3$ is evaporated at 100 angstrom as an electron transport layer. They are evaporated in succession without being exposed to the air, i.e., in a vacuum. Thus, organic EL films 21 are formed.

Further, an Mg/Ag alloy (weight ratio: 10:1) film is evaporated at a thickness of 2,000 angstrom as second electrodes 22 without being exposed to the air, i.e., in a vacuum. Then, Al films 23 and $SiO_2$ protecting films 24 are formed in succession by sputtering in the same manner as in the processes of FIGS. 4B and 4C.

Finally, the resist films 20, the various thin films formed thereon, and the spacers 19 are removed by a removing solution, to provide a desired simple matrix organic EL display device as shown in FIG. 7B.

According to this embodiment, since the evaporation method can be one in which the uniformity of films are regarded as important, the yield can be increased and the light emission characteristic can be made uniform.

Conventionally, material not resistant to water or oxygen is necessarily exposed to the air even temporarily, which decreases the reliability of organic EL elements thereby. In contrast, the invention can provide organic EL elements with very high reliability because the organic EL film can be completely covered with a material that is stable with respect to water and oxygen on each display line (pixel line).

Numerical values used in the invention are merely examples and the invention is not limited to those values.

According to the invention, the overhanging portions wider than the spacers can easily be formed by overetching. By the existence of the overhanging portions, the organic EL elements can be isolated easily.

According to the invention, since only the overhanging portions formed on the spacers can be removed, a sealing glass substrate or the like for sealing the entire device can easily be provided over the organic EL elements.

According to the invention, since not only the overhanging portions but also the spacers can be removed, even an adhesive containing a solvent capable of dissolving a resist or the like can be used as the adhesive for adhering a sealing glass substrate or the like to the device. This allows selection of an adhesive from a wide variety of and various kinds of adhesives.

Further, according to the invention, the protecting films constructed by at least one of an insulating film and a metal film which is stable with respect to oxygen, water and organic solvents can be formed on the second electrodes by using a method that can provide better step coverage than methods for forming the organic films and the second electrodes. This allows photolithography to be conducted thereafter. Thus, the embodiment enables manufacture of an organic EL display device having very high reliability and a long life.

Embodiment 3

FIGS. 13A–13C and 14A–14C are plan pattern views and sectional views of a light emitting portion of an organic EL display device having element isolating structure portions formed therein according to the invention. If the element isolating structure portions as shown in FIG. 1A are formed straight, the element isolation can be effected with a very high yield. However, in FIG. 13B that is a sectional view taken along a dot chain line B–B' in FIG. 13A, the undercut length tends to be short in a region inside a portion of an element isolating structure portion 121 where it is bent at 90° or less or a region inside its curved portion having a small curvature. As a result, there may occur a case that the light emitting portion and the element isolating structure portion are short-circuited with each other via a metal film 116 made of a stable metal that is hardly affected by water, oxygen, and organic solvents. This will cause a reduction in yield.

Figure 13A:
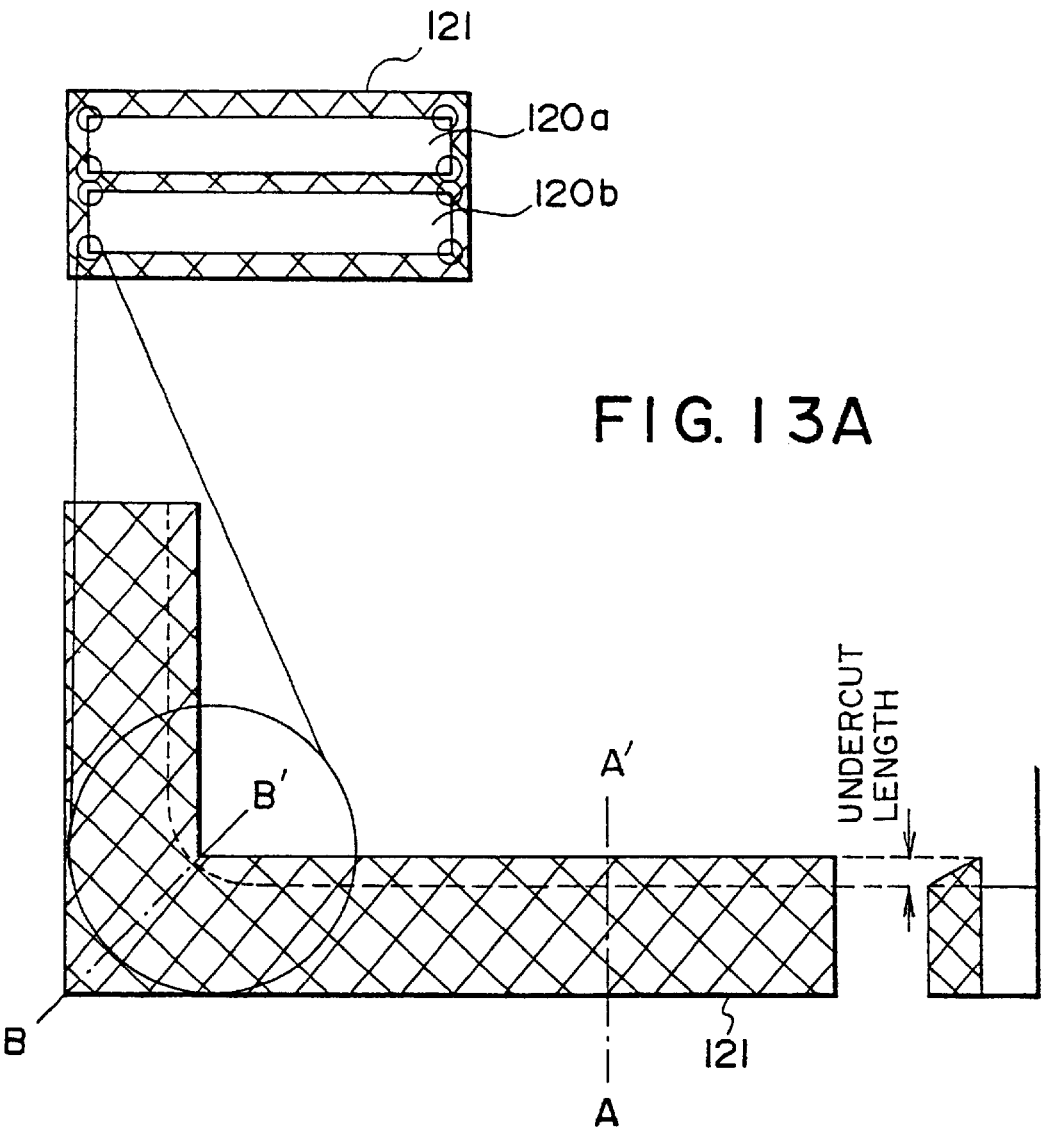
Figures 13B, 13C:
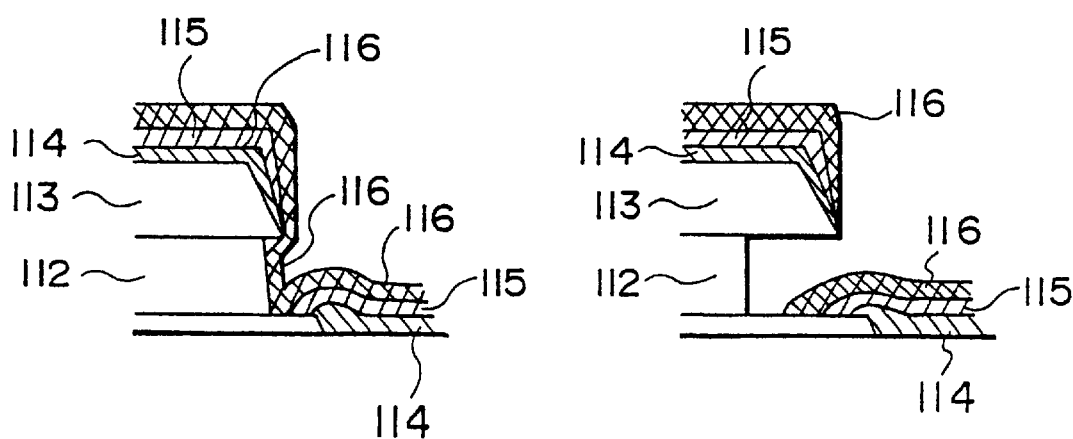

That is, in the case wherein light emitting portions 120a and 120b are isolated from each other by the element isolating structure portion 121 having an overhanging structure of FIG. 13A, if the bending portions have an angle of 90° or less, the undercut length becomes very short in the regions inside the bending portions as indicated by a dot line in the enlarged part of FIG. 13A. As a result, when an organic EL film 114, a second electrode 115, a metal film 116, and other films are formed in each of the light emitting portions 120a and 120b, the metal film 116 is formed also on the side surface of a spacer 112 in the undercut region where the undercut length is very short as shown in FIG. 13B. In this manner, the metal film 116 formed above a resist 113 and the light emitting portion 120a and 120b are connected to each other.

The short circuit may also occur in a region inside a curved bending portion of the element isolating structure portion which has a radius of curvature of 5 μm or less.

When the element isolating structure portion 121 is formed straight as in a portion indicated by a dot chain line A—A' in FIG. 13A, the undercut length of the spacer 112 is proper as shown in FIG. 13C that is a sectional view taken along line A–A' in FIG. 13A. Since the metal film 116 is not formed on the side surface of the spacer 112 so as to assume a thick film, the metal films 116 formed above and below the resist 113 are not short-circuited with each other.

Conversely, in a region outside a bending portion (90° or less) of the element isolating structure portion 121 (see FIG. 14A), an undercut region 117 becomes extremely long as shown in FIG. 14B that is a sectional view taken along a dot chain line B–B' in FIG. 14A. As a result, when the overhanging body of the element isolating structure portion 121 is constituted only of a resist 113, the overhanging body likely hangs down as shown in FIG. 14C. This may cause a short circuit between the metal films 116 which are formed on the light emitting portion and the outside portion of the element isolating structure portion 121 when the metal films 116 are formed. To reduce the number of lead out electrodes of a display device having complicated patterns, it is necessary to form element isolating structure portions that meander. It is desired to increase the yield in forming those element isolating structure portions.

When a bending portion of the element isolating structure portion has a bending angle of 90° or less or it is curved at a small radius of curvature of 5 μm or less, the reason why the undercut length varies with the shape of the plan pattern is considered non-uniformity in the degree of the action that an etching chemical goes around to act on the spacer film. Thus, in a region where the undercut length tends to be short, it is expected that the non-uniformity can be avoided by employing a plan pattern that allows an etching chemical to go around more easily.

It has been confirmed that a marked increase in yield can be obtained by forming a photomask pattern that is free of a portion where the element isolating structure portion is bent at a small angle of 90° or less as a simplest but effective method for attaining a plan pattern that allows an etching chemical to go around more easily in undercutting the spacer film.

Although a pattern bending angle larger than 90° is effective, the bending angle should be 100° or more and, more desirably, 135° or more. In experiments, portions having a bending angle of 135° show a difference in undercut length of only 30% as compared to straight portions. That is, it has been confirmed that the undercut length decreases by 30% in regions inside such bending portions from that of the straight portions, and that it increases by 30% in regions outside the bending portions.

When an organic EL display device having the element isolating structure portions on a substrate is manufactured by using the above described pattern, no short circuit is observed in the bending portions. A similar increase in yield is obtained by forming circular arc patterns having radii of curvature that are larger than 5 μm.

The third embodiment of the invention will be described in a more specific manner with reference to FIGS. 9A and 9B, which are plan pattern views and sectional views of light emitting portions of an organic EL display device according to the third embodiment of the invention. In FIG. 9A, an element isolating structure portion 31 isolates light emitting portions 32a and 32b constituted of organic EL films and other films. The element isolating structure portion 31 is composed of a resist 33 and a spacer 34, and regions inside its bending portions are bent at an angle of 135°.

In FIG. 9B that is a sectional view taken along a dot chain line A–A' in FIG. 9A, the regions inside and outside the spacer 34 which are formed under the resist 33 have sufficiently long undercut lengths of about 3 μm and about 4 μm, respectively. Thus, no short circuit occurs when a metal wiring film is formed on this structure.

As described above, according to the invention, a flat panel display using organic EL elements which can be manufactured at a stable, high yield and enables various lighting patterns is obtained.

Embodiment 4

FIGS. 10A and 10B are plan pattern views and sectional views of light emitting portions of an organic EL display device according to the fourth embodiment of the invention. In FIG. 10A, an element isolating structure portion 31' isolates light emitting portions 32a' and 32b' constituted of organic EL films and other films. The element isolating structure portion 31' is composed of a resist 33' and a spacer 34', and regions inside its bending portions assume circular arcs having a radius of 10 μm.

In FIG. 10B that is a sectional view taken along a dot chain line A–A' in FIG. 10A, the regions inside and outside the spacer 34' formed under the resist 33' have sufficiently long undercut lengths of about 3 μm and about 4 μm, respectively. Thus, no short circuit occurs when a metal wiring film is formed on this structure.

Embodiment 5

Figure 11A:
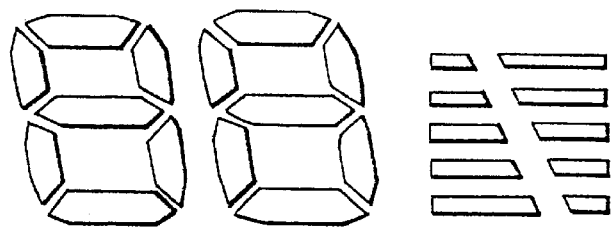
FIGS. 11A–11C are plan pattern views of a display portion of an organic EL display device according to a fifth embodiment of the invention.
Figure 11B:
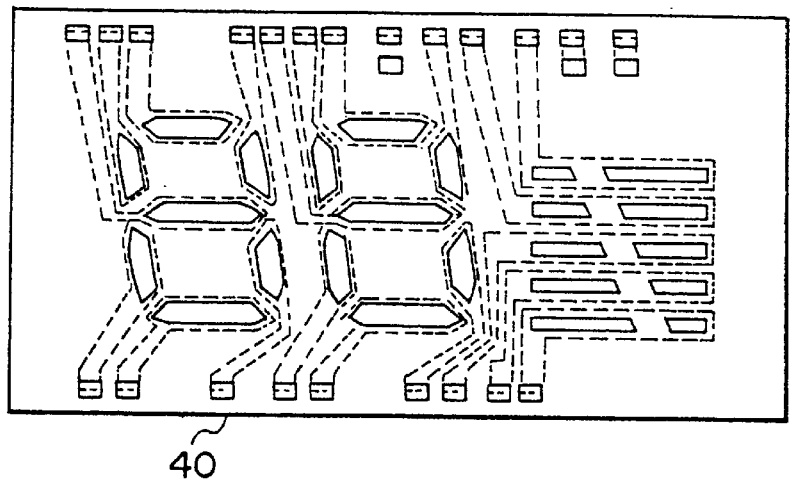
Figure 11C:
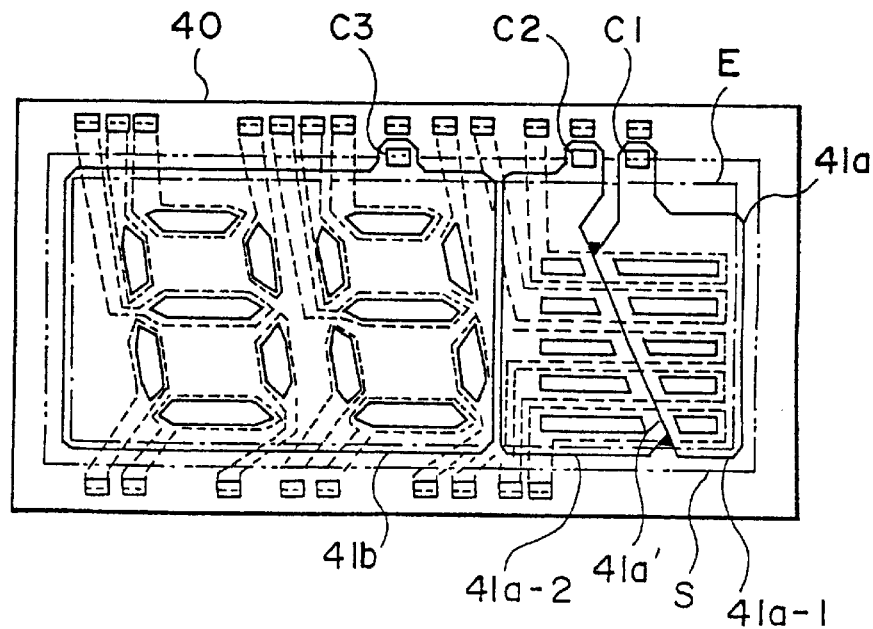

FIGS. 11A–11C are plan pattern views of a display portion of an organic EL display device according to a fifth embodiment of the invention, and FIGS. 12A–12H are plan pattern views and sectional views of a bar graph portion of the display portion of the above organic EL display device. The fifth embodiment is directed to a case of manufacturing a digit digital counter with a bar graph.

FIG. 11A is a view of a 2-digit digital counter as viewed from the organic EL film side (i.e., the bask side) rather than from the transparent substrate side (i.e., the display side), and is hence a mirror image of an ordinary view as viewed from the display side. FIG. 11A also shows light emitting regions as viewed from the organic EL film side.

FIG. 11B shows a relationship between the pattern of ITO films (indicated by dot lines) formed on a substrate 40 and openings (where the ITO films are exposed; indicated by solid lines) that are obtained by partially removing an insulating film formed on the ITO films.

FIG. 11C shows element isolating structure portions 41a and 41b, an area E where organic EL films and second electrode portions are formed, and an area S where metal wirings made of a stable metal hardly affected by water, oxygen, and organic solvents and protecting films are formed. The element isolating structure portion 41a isolates the bar graph from the numeral displaying portion as well as isolates the bar graph into two sections. The element isolating structure portion 41b encloses the numeral display portion.

After the openings (indicated by solid lines) are formed by partially removing the insulating film formed on the pattern of the ITO films (indicated by dot lines) as shown in FIG. 11B, the element isolating structure portions 41a and 41b are formed as shown in FIG. 11C. As described later, the element isolating structure portions 41a and 41b are formed with a pattern in which every bending portion has a bending angle of 135°. The element isolating structure portion 41a includes a slant straight portion 41a' formed at the center of the 2-figure bar graph.

After the element isolating structure portions 41a and 41b are formed, organic EL films and second electrodes containing a metal having a small work function are formed by evaporation in the area E indicated by the dot chain line, and metal films and protection films are formed in the area S indicated by the two-dot chain line (see FIG. 11C). At this time, a common electrode C1 is connected to the metal film of the element isolating structure portion 41a-1 located on the right side of the slant straight portion 41a', and a common electrode C2 is connected to the metal electrode of the element isolating structure portion 41a-2 located on the left side of the slant straight portions 41a'. A common electrode C3 is connected to the metal electrode of the element isolating structure portion 41b.

A manufacturing process of the bar graph will be described with reference to FIGS. 12A–12H. FIGS. 12A–12D are plan views of the bar graph pattern, and FIGS. 12E–12H are sectional views taken along dot chain lines A–A', B–B', C–C', and D–D' in FIGS. 12A–12D, respectively.

An inexpensive soda glass substrate is used as a substrate 40 for an organic EL display device. A silica coating is performed for the entire surface of the substrate 40. The silica coating prevents sodium from being eluted from the glass substrate when it is heated, protects the soda glass substrate that is not resistant to acids and alkalis, and improves the flatness of the glass substrate surface.

Next, an ITO film which is a transparent conductive film as a first electrode is formed at a thickness of 1,000 angstrom on the glass substrate 40 by sputtering. The use of the ITO film is due to the fact that it exhibits superior characteristics to films made of other materials when used as a transparent conductive film. However, a transparent electrode of a ZnO film, $SnO_2$ film, or the like may also be used if it has transmittance and resistivity, for example, that will not cause any problem during use. When the ITO film is formed over a large area, sputtering is advantageous in uniformity and film quality of a resulting film as well as productivity. The ITO film need not always be formed by sputtering, and may be formed by evaporation, for example.

After a resist pattern is formed on the formed ITO film by photolithography, unnecessary portions of the ITO film are removed by etching and then the resist is removed, to leave a desired electrode pattern of the ITO film 41 (see FIGS. 12A and 12E).

Next, a film for determining the light emitting regions is formed on the ITO film 41. Any insulating film may be used as this film. The film may be formed by various methods: forming an inorganic thin film such as an $SiO_2$ film or an $SiN_x$ film by sputtering or vacuum evaporation, forming an $SiO_2$ film by SOG coating, and applying resist, polyimide, acrylic resin, or the like. Since it is necessary to expose a portion of the ITO films 41 formed under the insulating film, the insulating film needs to be patterned without damaging the ITO film 41. Although there is no limitation on the thickness of the insulating film, when an inorganic thin film is used, the manufacturing cost can be reduced by decreasing the thickness thereof.

In this embodiment, polyimide is used to form the insulating film. Non-photosensitive polyimide to be prepared is diluted to about 5% with NMP or γ-butyrolactone. Such polyimide is applied by spin coating, and then prebaked at 145° C. for one hour. After a positive resist is applied, patterning is performed (see FIGS. 12B and 12F).

Exposed portions of the resist and corresponding portions of the polyimide film are removed sequentially with, an aqueous solution of TMAH having a concentration of about 2.38%. TMAH is a developer for the resist. Further, only the remaining portions of the resist are removed by ethanol, to form a desired insulating film 42. Although the above description is directed to the case of using non-photosensitive polyimide, photosensitive polyimide may also be used. In this case, no resist is needed.

The polyimide insulating film 42 thus obtained is completely cured at a temperature not higher than 350° C. so as not to be affected by chemical solutions to be used in later process. Since the insulating film 42 contract at this time, the steps are tapered. Thus, a pattern for exposing only the light emitting portions and connecting portions to external circuits is obtained (see FIG. 12B) Subsequently, a spacer film to be used as a spacer 43 is formed (see FIG. 12G). Because of their purpose, the spacer 43 may be either a conductor or an insulator, and have either a single layer or multilayer structure. However, when the spacer 43 is a conductor, there is a possibility that metal films formed in a later process cause a short circuit or a current leak between adjacent display lines via a spacer 43. This problem may be solved by making the undercut amount in etching the spacer film sufficiently large.

As described above, the spacer made of a metal has the following advantages. (1) Since the spacer is sufficiently strong and malleable, the elements that are easily rendered faulty due to the existence of dust can sufficiently be cleaned with ultrasonic waves, for example. (2) Since the spacer is more resistant to heat than a resist etc., dehydration can be effected by heat treatment. (3) Since the spacer is hardly charged, particles are less likely to attach to the spacer. (4) When a short circuit occurs; in an element circuit due to dust, the spacer can be burnt off.

It is necessary to select an etching material for the spacer film which neither etches nor affects the ITO film 41 that are in contact with the spacer film in etching the spacer film. Also, since the spacer film is used to form the spacer 43, it should be so formed as to be thicker than all of an organic EL film, a second electrode, a protecting film, and other films. Thus, it is desirable that the spacer film be made of a material which allows easy formation of a thick spacer film. Examples of such a film are an SOG film and a resin film. When the spacer film is made of a metal material, a laminate structure of a Cr film, a Ti film, a TiN film, or other film as an etching barrier film formed on the ITO film 41 to prevent their etching and an Al film or other film which has a high formation rate may be formed. The etching barrier film is not limited to a metal material.

When polyimide is used to form the spacer 43, polyimide whose concentration has been adjusted to 15% is spin-coated at a thickness of 2 $\mu$m, and then prebaked at 145° C. for one hour. The thickness of polyimide can be adjusted by the concentration of the solution to be applied by spin coating and the rotational speed of the spin coater. The polyimide film can be made thicker by increasing the concentration or decreasing the rotational speed.

Subsequently, a positive resist is applied to the prebaked polyimide film. When the thickness of the positive resist is not less than 1 $\mu$m, desirably not less than 2 $\mu$m, a highly viscous resist is used or the rotational speed of the spin coater is set low.

Since the positive resist is relatively fragile, the method of forming a thick resist is employed in this embodiment. However, no such method is needed if a harder film is formed and then a resist is applied thereon, i.e., if a harder film is formed under the resist to support the resist, as described above. That is, it is not necessary to increase a thickness of the resist. The use of the harder film such as a support film has another advantage that a dehydration treatment by heating for eliminating water absorbed on the substrate surface can be performed in a later process. Conversely, if a heat treatment is performed without formation of the support film, the resist becomes likely to be deformed and undercut regions may be broken. Further, if the support film is made even stronger, since the overhanging portions remain even after removal of the resist, dehydration by heating the substrate to a temperature no lower than the maximum heat resistant temperature of the resist can be performed. Thus, as described above, the structure as shown in FIG. 20 can be also formed so that the harder film 64 as the support film supports the resist 65 as a photosensitive material.

Exposure and development are performed to form a desired photolithography pattern of the element isolating structure portion 41a. Portions of the polyimide film which are exposed by this resist development are also removed subsequently to the removal of the resist.

As shown in FIG. 12C, even in bending portions of the pattern which may be given an angle of 90°, the number of bending portions is increased to provide larger bending angle. That is, the patterning is so made that the bending portions have a bending angle of 135°.

The undercut amount of the polyimide film formed under the resist is determined based on the development time. The undercut amount is also greatly influenced by the polyimide prebaking temperature and time. In particular, it is necessary to control the prebaking temperature so that the film quality of the polyimide film be uniform over the entire substrate surface. In this embodiment, the development time is so determined that the undercut length becomes about 4 $\mu$m. In this manner, as shown in FIG. 12G, an element isolating structure portion having the polyimide spacer 43 and a resist 44 is formed similar to that of FIG. 1A.

Next, TPD as a hole injection layer/hole transport layer of an organic EL film, Alq$_3$ as a light emitting layer/electron transport layer of the organic EL film, and an Mg/Ag alloy (weight ratio:10:1) film as a second electrode are consecutively evaporated in a consecutive evaporation chambers without being exposed to the air, i.e., in a vacuum. The thickness of each of the TPD layer and the Alq$_3$ layer is set at 500 angstrom and the thickness of the Mg/Ag alloy layer is set at 2,000 angstrom.

In the invention, the constituent films of the organic EL element and the order of laying those films are not limited to those of this embodiment. The hole injection layer, the light emitting layer, and the second electrode may be made of materials other than the above ones. A hole injection layer, an electron transport layer, an electron injection layer, and other layers may additionally be formed to provide laminate structures. Further, the thicknesses of the respective films are not limited to those of the embodiment. That is, the invention is applicable irrespective of the kinds of film forming materials and the structure of the films.

The respective films of TPD, Alq$_3$, and the second electrode are formed only in the area E by using a metal mask provided in the evaporation apparatus. In FIGS. 12D and 12H, an organic EL constituent film 45 including the organic light emitting layer includes organic films such as TPD and Alq$_3$ and the second electrode.

After the evaporation of TPD serving as the hole injection layer/hole transport layer, Alq$_3$ serving as the light emitting layer/electron transport layer, and the second electrode, a TiN film and an Al film are formed in succession by sputtering without being exposed to the air, i.e., in a vacuum, to form a metal wiring film 46 (see FIG. 12H). The TiN film is formed between the Al film and the patterned ITO film as the connection electrode terminal to improve the contact performance between those films.

The metal wiring film 46 is formed via the metal mask. The opening size of the metal mask is so designed that the metal wiring film is not formed on the portions where lead out wirings for the ITO film located outside the area enclosed by the two dot chain line (see FIG. 11C) are connected to external circuits. Thus, the metal wiring film 46 is formed only in the area S enclosed by the two dot chain line in FIG. 11C.

The resulting digital counter with the bar graph is divided by the element isolating structure portions 41a-1, 41a-2, and 42a. The three second electrodes are provided therein (see FIG. 1C). The common electrode C3 for numeral display is always grounded electrically. The common electrodes C1 and C2 are supplied with a voltage having an operation frequency of 60 Hz and a duty ratio of 1/2; that is, they are supplied with the grounding voltage and the same voltage as the first electrode alternately.

When the common electrode is not divided, the number of electrode terminals connected to the bar graph portion is the same as the number of electrode terminals connected to the numeral display portion, i.e., 10. In this case, the common electrode is shared by the bar graph portion and the numeral display portion. On the other hand, if the common electrode is divided, the number of total terminals can be made 7:5 terminals that are connected to the first electrodes plus 2 terminals for the common electrodes C1 and C2. As such, the invention is effective in dividing common electrodes of various shapes with a high yield.

Although this embodiment is directed to the case where the bending portions of the plan pattern of the element isolating structure portions have an angle larger than 90°, the same advantages can be obtained even in a case where the bending portions of the plan pattern are so formed as to assume circular arcs having a radius of curvature larger than 5 $\mu$m.

As described above, by etching the spacer film so that the undercut length does not have a large variation (the uniformity of the undercut length is improved) in the regions inside and outside the bending portions of the plan pattern of the element isolating structure portions, overhanging portions are overhang by a sufficient amount in the above inside and outside regions. Thus, organic EL elements can be isolated certainly.

The invention provides the following superior advantages:

(1) Since the bending portions of the plan pattern of the element isolating structure portions having an overhanging structure have angles larger than 90°, the yield of element isolation can be increased remarkably. If the angles of the bending portions are made 135° or more, the element isolating structure portions can be formed while a short circuit is completely avoided in the bending portions.

(2) Since the bending portions of the plan pattern of the element isolating structure portions are formed by circular arcs having radii of curvature larger than 5 $\mu$m, the yield of element isolation can be increased remarkably. If the radii of curvature of the circular arcs of the bending portions are 10 μm or more, the element isolating structure portions can be formed while a short circuit is completely avoided in the bending portions.

(3) Since the uniformity of the undercuts of the element isolating structure portions are greatly improved, an organic EL display device can be manufactured at a high yield. Further, since the second electrodes of various shapes which are isolated electrically can be formed, an organic EL display device of the invention can be applied to products of various kinds of display method.

What is claimed is:

1. A method for producing an organic electroluminescence display device, comprising the steps of:
   forming a first electrode which is transparent on a substrate;
   selectively forming an insulating film on the first electrode;
   forming a spacer film on the insulating film;
   forming a photosensitive film directly on the spacer film;
   selectively forming a plurality of cap-shaped portions of the photosensitive film;
   forming a spacer under each cap-shaped portion by over-etching the spacer film, so that the cap-shaped portion overhangs each spacer;
   forming an organic electroluminescence film on the first electrode and between adjacent spacers; and
   forming a second electrode on the organic electroluminescence film.

2. The method of claim 1 wherein the spacer is in contact with each cap-shaped portion.

3. The method of claim 2 wherein the spacer is resin and each cap-shaped portion is photosensitive resin.

4. The method of claim 3 wherein the spacer is polyimide and each cap-shaped portion is positive resin.

5. A method for producing an organic electroluminescence display device, comprising the steps of:
   forming a first electrode which is transparent on a substrate;
   selectively forming an insulating film on the first electrode;
   forming a spacer film on the insulating film;
   forming a photosensitive film on the spacer film;
   forming a plurality of cap-shaped portions by developing the photosensitive film in developer;
   subsequently forming a spacer under each cap-shaped portion by etching the spacer film in the same developer so that the cap-shaped portion overhangs each spacer;
   forming an organic electroluminescence film formed on the first electrode and between adjacent spacers; and
   forming a second electrode formed on the organic electroluminescence film.

6. The method of claim 5 wherein the spacer is in contact with each cap-shaped portion.

7. The method of claim 6 wherein the spacer is resin and each cap-shaped portion is photosensitive resin.

8. The method of claim 7 wherein the spacer is polyimide and each cap-shaped portion is positive resin.

9. An organic electroluminescence display device, comprising:
   a first electrode which is transparent and formed on a substrate;
   an insulating film selectively formed on the first electrode;
   a plurality of spacers formed on the insulating film;
   a cap-shaped portion directly on each spacer having a width wider than that of each spacer, wherein the cap-shaped portion is comprised of a photosensitive material which is made resistant to a developer, the spacer being of a material which can be etched by the developer;
   an organic electroluminescence film formed on the first electrode and between adjacent spacers; and
   a second electrode formed on the organic electroluminescence film.

10. The device of claim 9 wherein the cap-shaped portion is in contact with each spacer.

11. The device of claim 10 wherein the cap-shaped portion is photosensitive resin and each spacer is resin.

12. The device of claim 11 wherein the cap-shaped portion is positive resin and each spacer is polyimide.

* * * * *